(12) United States Patent
Fukuzawa et al.

(10) Patent No.: US 12,085,721 B2
(45) Date of Patent: Sep. 10, 2024

(54) OPTICAL WAVEGUIDE DETECTION ELEMENT, VIDEO LASER MODULE, AND XR GLASSES

(71) Applicant: TDK CORPORATION, Tokyo (JP)

(72) Inventors: Hideaki Fukuzawa, Tokyo (JP); Tomohito Mizuno, Tokyo (JP); Tetsuya Shibata, Tokyo (JP); Tsuyoshi Komaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/373,007

(22) Filed: Sep. 26, 2023

(65) Prior Publication Data

US 2024/0103277 A1    Mar. 28, 2024

(30) Foreign Application Priority Data

Sep. 28, 2022    (JP) ................ 2022-154977

(51) Int. Cl.

| | |
|---|---|
| *G02B 6/12* | (2006.01) |
| *G02B 6/125* | (2006.01) |
| *G02B 27/00* | (2006.01) |
| *G02B 27/01* | (2006.01) |
| *H10N 50/10* | (2023.01) |

(52) U.S. Cl.
CPC ..... *G02B 27/0172* (2013.01); *G02B 6/12004* (2013.01); *G02B 6/12007* (2013.01); *G02B 6/125* (2013.01); *G02B 27/0093* (2013.01); *H10N 50/10* (2023.02); *G02B 2006/12104* (2013.01); *G02B 2027/0178* (2013.01)

(58) Field of Classification Search
CPC ............ G02B 27/0093; G02B 27/0172; G02B 27/0178; G02B 6/12004; G02B 6/12007; G02B 6/125; G02B 2006/12104; H10N 50/10

See application file for complete search history.

(56) References Cited

U.S. PATENT DOCUMENTS

| | | | |
|---|---|---|---|
| 9,588,289 B1* | 3/2017 | Astier ................ | G01N 15/1436 |
| 2008/0198385 A1* | 8/2008 | Peale ................. | G02B 6/12007 356/450 |
| 2020/0081530 A1 | 3/2020 | Greenberg | |
| 2020/0150428 A1 | 5/2020 | Greenberg | |
| 2021/0405290 A1* | 12/2021 | Hayenga ............ | G02B 6/12007 |
| 2023/0229056 A1* | 7/2023 | Fukuzawa .............. | G02F 1/212 359/245 |

* cited by examiner

*Primary Examiner* — Ryan A Lubit
(74) *Attorney, Agent, or Firm* — Oliff PLC

(57) ABSTRACT

This optical waveguide detection element includes a substrate, an optical waveguide layer formed on the substrate, and a photodetector. The optical waveguide layer includes a first optical waveguide in which visible light having a wavelength of 380 nm to 800 nm propagates, a second optical waveguide in which near-infrared light having a wavelength of 801 nm to 2000 nm propagates, and a third optical waveguide in which light propagates to a light receiving surface of the photodetector. A visible light output port of the first optical waveguide from which the visible light is output, a near-infrared light output port of the second optical waveguide from which the near-infrared light is output, and a reflected light input port of the third optical waveguide to which the near-infrared light is reflected and returned are arranged on one end surface of the optical waveguide layer.

20 Claims, 26 Drawing Sheets

OPTICAL WAVEGUIDE DETECTION ELEMENT, VIDEO LASER MODULE, AND XR GLASSES

CROSS-REFERENCE TO RELATED APPLICATION

The present application claims priority on Japanese Patent Application No. 2022-154977 filed on Sep. 28, 2022, the content of which is incorporated herein by reference.

BACKGROUND OF THE INVENTION

Field of the Invention

The present invention relates to an optical waveguide detection element, a video laser module, and XR glasses.

Description of Related Art

XR glasses such as augmented reality (AR) glasses and virtual reality (VR) glasses are expected to be small wearable devices. The key to widespread use of wearable devices such as AR glasses and VR glasses is to implement miniaturization so that each function fits within the size of ordinary eyeglasses.

XR glasses such as AR glasses and VR glasses proposed so far have not been miniaturized because a video light source module and an eye tracking module are separate. Also, in the case where the video light source module and the eye tracking module are separate, optical axis alignment is significantly complicated.

Patent Documents

[Patent Document 1] United States Patent Application, Publication No. 2020/0081530
[Patent Document 2] United States Patent Application, Publication No. 2020/0150428

SUMMARY OF THE INVENTION

The present invention has been made in view of the above-described problems and an objective of the present invention is to provide an optical waveguide detection element, a video laser module, and XR glasses capable of integrating a video light source module and an eye tracking module.

The present invention provides the following solutions to solve the above-described problems.

According to Aspect 1 of the present invention, there is provided an optical waveguide detection element including: a substrate; an optical waveguide layer formed on the substrate; and a photodetector, wherein the optical waveguide layer includes a first optical waveguide in which visible light having a wavelength of 380 nm to 800 nm propagates, a second optical waveguide in which near-infrared light having a wavelength of 801 nm to 2000 nm propagates, and a third optical waveguide in which light propagates to a light receiving surface of the photodetector, and wherein a visible light output port of the first optical waveguide from which the visible light is output, a near-infrared light output port of the second optical waveguide from which the near-infrared light is output, and a reflected light input port of the third optical waveguide to which the near-infrared light is reflected and returned are arranged on one end surface of the optical waveguide layer.

According to Aspect 2 of the present invention, there is provided a video laser module including: the optical waveguide detection element according to Aspect 1; a visible laser light source configured to output the visible light; and a near-infrared laser light source configured to output the near-infrared light.

According to Aspect 3 of the present invention, there are provided XR glasses including: glasses; and the video laser module according to Aspect 2 mounted on the glasses.

According to the aspects of the present invention, it is possible to provide an optical waveguide detection element capable of integrating a video light source module and an eye tracking module.

DETAILED DESCRIPTION OF THE INVENTION

Figure 1:
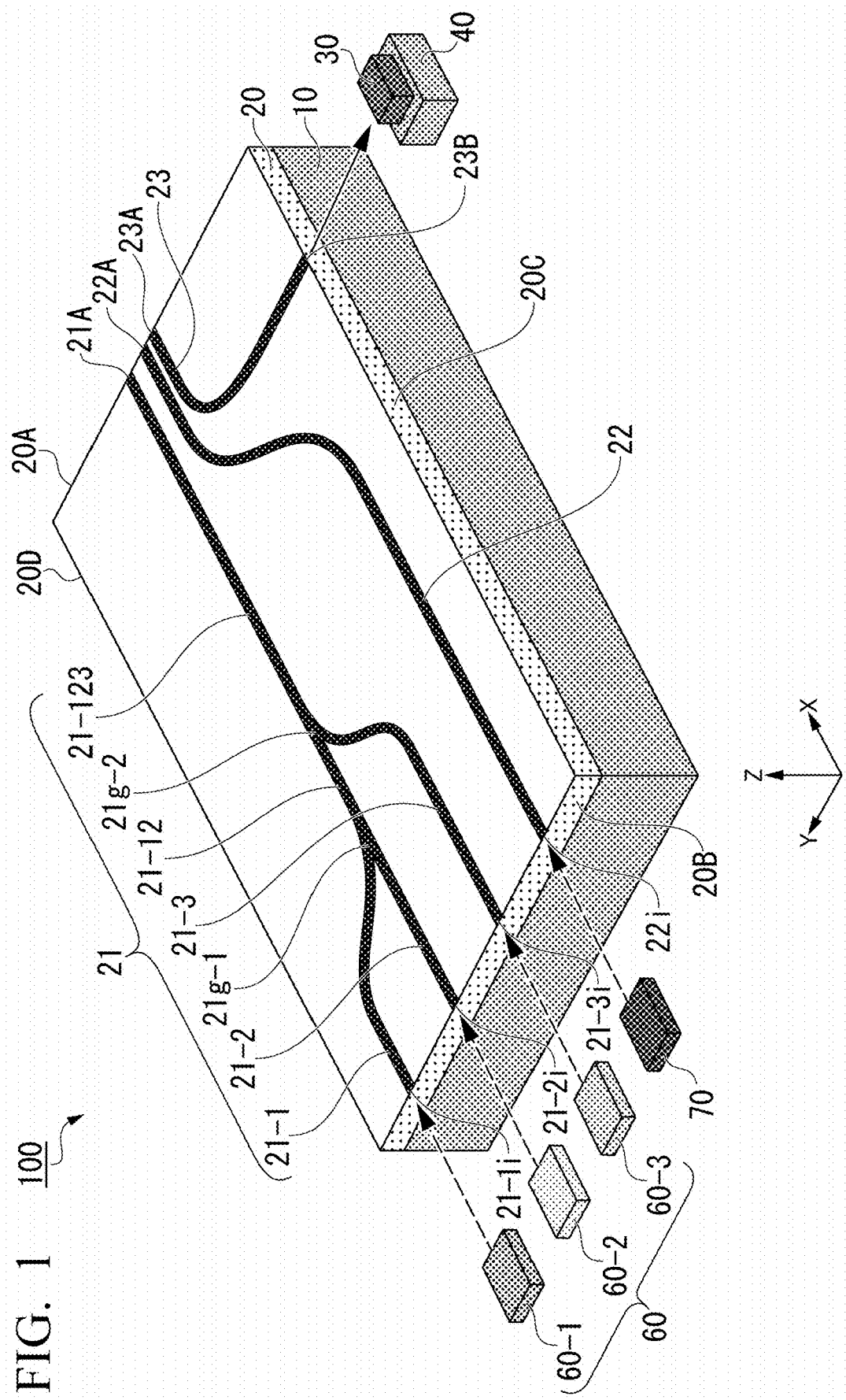
FIG. 1 is a schematic perspective view of an optical waveguide detection element according to a first embodiment.

Hereinafter, embodiments will be described in detail with reference to the drawings as appropriate. In the drawings used in the following description, featured parts may be enlarged for convenience such that the features of the present invention are easier to understand, and dimensional ratios and the like of the respective components may be different from actual ones. Materials, dimensions, and the like exemplified in the following description are examples, the present invention is not limited thereto, and modifications can be appropriately made in a range in which advantageous effects of the present invention are exhibited.

Optical Waveguide Detection Element

First Embodiment

Figure 2:
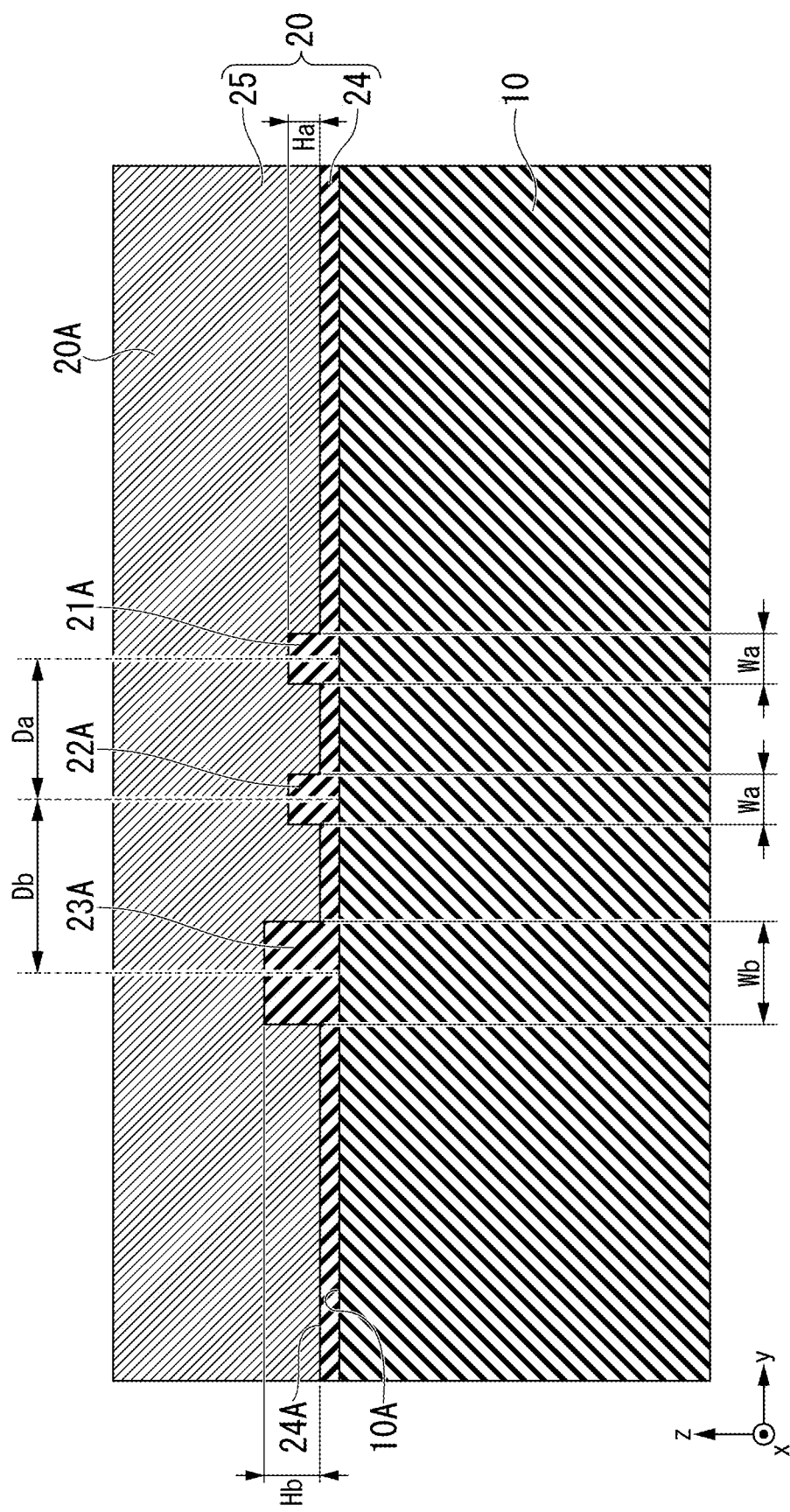
FIG. 2 is a schematic plan view of the optical waveguide detection element according to the first embodiment viewed from an output surface of visible light and near-infrared light.

FIG. 1 is a schematic perspective view of an optical waveguide detection element according to a first embodiment. FIG. 2 is a schematic plan view of the optical waveguide detection element according to the first embodiment viewed from an output surface of visible light and near-infrared light.

An optical waveguide detection element 100 shown in FIG. 1 includes: a substrate 10; an optical waveguide layer 20 formed on the substrate 10; and a photodetector 30, wherein the optical waveguide layer 20 includes: a first optical waveguide 21 in which visible light having a wavelength of 380 nm to 800 nm propagates; a second optical waveguide 22 in which near-infrared light having a wavelength of 801 nm to 2000 nm propagates; and a third optical waveguide 23 in which light propagates to a light receiving surface of the photodetector 30, and wherein a visible light output port 21A of the first optical waveguide 21 from which the visible light is output, a near-infrared light output port 22A of the second optical waveguide 22 from which the near-infrared light is output, and a reflected light input port 23A of the third optical waveguide 23 to which the near-infrared light is reflected and returned are arranged on one end surface 20A of the optical waveguide layer 20.

Because near-infrared light is invisible, it can be used for eye tracking.

In FIG. 1, visible laser light sources (R, G, and B) and a near-infrared laser light source (IR) are also shown. The visible laser light sources (R, G, and B) and the near-infrared laser light source (IR) are denoted by reference signs 60-1, 60-2, 60-3, and 70, respectively. A video laser module to be described below or the like includes the optical waveguide detection element 100, the visible laser light sources 60 (60-1, 60-2, and 60-3), and the near-infrared laser light source 70. The video laser module will be described after the description of the optical waveguide detection element.

Because the optical waveguide detection element 100 has a configuration in which the visible light output port 21A from which the visible light is output, the near-infrared light output port 22A from which the near-infrared light is output, and the reflected light input port 23A to which the near-infrared light is reflected and returned are arranged on one end surface 20A of the optical waveguide layer 20, miniaturization is implemented in accordance with a size of the optical waveguide layer 20. Also, the first optical waveguide 21, the second optical waveguide 22, and the third optical waveguide 23 can be aligned with the optical axis in lithography.

The optical axis alignment between the light receiving surface of the photodetector 30 and the reflected light input port 23A of the third optical waveguide 23 will be described below.

Examples of the substrate 10 include a sapphire substrate, a Si substrate, a thermal silicon oxide substrate, and the like.

Although there is no particular limitation as long as the film has a lower refractive index than the lithium niobate film in the case where the first optical waveguide 21, the second optical waveguide 22, and the third optical waveguide 23 are formed of a lithium niobate (LiNbO$_3$) film, a sapphire single-crystal substrate or a silicon single-crystal substrate is preferred as a substrate on which a single-crystal lithium niobate film can be formed as an epitaxial film. Although the crystal orientation of the single-crystal substrate is not particularly limited, for example, because the c-axis-oriented lithium niobate film has 3-fold symmetry, it is preferable that the underlying single-crystal substrate also have the same symmetry and the substrate of the c-plane in the case of a sapphire single-crystal substrate or the substrate of the (111) plane in the case of a silicon single-crystal substrate is preferred.

The sizes of the substrate 10 are, for example, 1 mm to 20 mm, 1 mm to 15 mm, and 0.3 mm to 1.5 mm in the X-direction, the Y-direction, and the Z-direction, respectively.

In the example shown in FIG. 1, the optical waveguide layer 20 has a waveguide core film 24 having a first optical waveguide 21, a second optical waveguide 22, and a third optical waveguide 23 and a waveguide cladding film 25 formed on the waveguide core film 24 so that the first optical waveguide 21, the second optical waveguide 22, and the third optical waveguide 23 are covered.

Examples of the waveguide core film 24 can include a lithium niobate film or a $SiO_2$ film.

Hereinafter, a case where the waveguide core film 24 is a lithium niobate film will be described as an example. Hereinafter, it may be referred to as a lithium niobate film 24.

The lithium niobate film is, for example, a c-axis-oriented lithium niobate film. The lithium niobate film is, for example, an epitaxial film epitaxially grown on the substrate 10. The epitaxial film is a single-crystal film in which the crystal orientation is aligned by the base substrate. The epitaxial film is a film having a single-crystal orientation in the z-direction and the xy-plane direction and the crystals are aligned and oriented along the x-axis, the y-axis, and the z-axis. It is possible to prove whether or not the film formed on the substrate 10 is an epitaxial film, for example, by confirming the peak intensity and the extreme point at the orientation position in 2θ-θ X-ray diffraction.

Specifically, when the 2θ-θ X-ray diffraction is measured, all peak intensities other than that of a target surface are 10% or less, preferably 5% or less of a maximum peak intensity of the target surface. For example, in the case where the lithium niobate film is a c-axis-oriented epitaxial film, the peak intensity other than that of the (00L) plane is 10% or less, preferably 5% or less of the maximum peak intensity of the (00L) plane. (00L) is an indication that collectively refers to equivalent surfaces such as (001) and (002).

Also, in the conditions for confirming the peak intensity at the above-described orientation position, only an orientation in one direction is shown. Therefore, even if the above-described conditions are obtained, when the crystal orientation is not aligned in the plane, the intensity of the X-rays does not increase at a specific angle position and the extreme point is not seen. For example, in the case of a lithium niobate film, because $LiNbO_3$ has a trigonal crystal structure, the number of extreme points of $LiNbO_3$ (014) in a single crystal becomes three.

In the case of lithium niobate, it is known that epitaxial growth occurs in a so-called twined crystal state in which crystals rotated 180° around the c-axis are symmetrically bonded. In this case, because the three extreme points are symmetrically joined by two, the number of extreme points is six. Also, in the case where a lithium niobate film is formed on a silicon single-crystal substrate on the (100) plane, because the substrate has four-fold symmetry, 4×3=12 extreme points are observed. Also, in the present disclosure, a lithium niobate film epitaxially grown in a twined crystal state is also included in the examples of the epitaxial film.

The composition of lithium niobate is $Li_xNbA_yO_z$. A is an element other than Li, Nb, and O. x is 0.5 or more and 1.2 or less, preferably 0.9 or more and 1.05 or less. y is 0 or more and 0.5 or less. z is 1.5 or more and 4.0 or less, preferably 2.5 or more and 3.5 or less. The element A is, for example, K, Na, Rb, Cs, Be, Mg, Ca, Sr, Ba, Ti, Zr, Hf, V, Cr, Mo, W, Fe, Co, Ni, Zn, Sc, or Ce, and two or more of these elements may be combined.

A thickness of the lithium niobate film is, for example, 2 μm or less. The thickness of the lithium niobate film is a film thickness of a portion other than a ridge portion. If the thickness of the lithium niobate film is thick, the crystallinity may decrease.

Also, the thickness of the lithium niobate film is, for example, about 1/10 or more of the wavelength of light that is used. In the case where the film thickness of the lithium niobate film is thin, the confinement of light is weakened and light leaks into the substrate 10 and the waveguide cladding film 25.

The first optical waveguide 21, the second optical waveguide 22, and the third optical waveguide 23 are optical pathways through which light propagates. The first optical waveguide 21, the second optical waveguide 22, and the third optical waveguide 23 are ridges protruding from the first surface 24A of the lithium niobate film 24. Hereinafter, the first optical waveguide 21, the second optical waveguide 22, and the third optical waveguide 23 are referred to as a first ridge 21, a second ridge 22, and a third ridge 23, respectively. The first surface 24A is an upper surface in a portion (a slab layer) other than the ridge portion of the lithium niobate film 24. The lithium niobate film 24 includes the ridges 21, 22, and 23 and the slab layer.

A cross-sectional shape of a cross-sectional shape formation part of the first ridge 21, the second ridge 22, and the third ridge 23 shown in FIG. 2 is rectangular, but may be any shape as long as it can guide light. For example, it may be trapezoidal, triangular, semicircular, or the like. Widths Wa and Wb of the three ridges in the y-direction are preferably 0.3 μm or more and 5.0 μm or less, and the heights of the three ridges (protruding heights Ha and Hb from the first surface 24A) are preferably, for example, 0.1 μm or more and 1.0 μm or less.

Although the first ridge 21 and the second ridge 22 have the same height Ha and a height Hb of the third ridge 23 is higher than the height Ha in the example shown in FIG. 1, all three ridges may have the same height or all three heights may be different heights.

In the case of a configuration in which the first ridge 21 and the second ridge 22 have the same height and the third ridge 23 has a different height, the waveguide (the first ridge 21 and the second ridge 22) having a function of producing an output from the element has a low height at which it is easy to form a single mode, and the third ridge 23, which guides the reflected light, has an advantage that it is possible to guide the light generated in a multi-mode according to external reflection.

In the case where all three ridges, i.e., the first ridge 21, the second ridge 22, and the third ridge 23, have the same height, there is an advantage that cost reduction can be implemented because they can be collectively configured in a manufacturing process.

In the case where all three ridges, i.e., the first ridge 21, the second ridge 22, and the third ridge 23, have different heights, because a configuration suitable for the optimum wavelength for short wavelength light of red, green, and blue for a video, near-infrared light, and reflected light is adopted, it is difficult to generate multi-mode light and it is possible to perform a waveguide process with single mode light; and as a result, there is an advantage that the detection sensitivity of the video and the eye tracking can be increased.

As described above, each configuration has advantages according to the purpose.

Although the first ridge 21 and the second ridge 22 have the same width Wa and the width Wb of the third ridge 23 is greater than the width Wa, a configuration in which all three ridges have the same width or a configuration in which all three ridges have different widths may be adopted.

In the case of a configuration in which the first ridge 21 and the second ridge 22 have the same width and the third ridge 23 has a different width, a waveguide for producing an output from the element (the first ridge 21 and the second ridge 22) is designed with a narrow width that facilitates the formation of a single mode and the third ridge 23, which guides reflected light, can perform a waveguide process for light with both the single mode and multi-mode generated through external reflection as an advantage.

When all three ridges, i.e., the first ridge 21, the second ridge 22, and the third ridge 23, have the same width, there is an advantage that cost reduction can be implemented because collective management is possible in terms of manufacturing process management.

In the case where all three ridges, i.e., the first ridge 21, the second ridge 22, and the third ridge 23, have different widths, because a configuration suitable for the optimum wavelength for short wavelength light of red, green, and blue for a video, near-infrared light, and reflected light thereof is adopted, it is difficult to generate multi-mode light and it is possible to perform a waveguide process with single mode light; and as a result, there is an advantage that the detection sensitivity of the video and the eye tracking can be increased.

As described above, each configuration has advantages according to the purpose.

It is possible to perform a propagation process in the single mode by setting each of sizes of the first ridge 21, the second ridge 22, and the third ridge 23, i.e., the first optical waveguide 21, the second optical waveguide 22, and the third optical waveguide 23, to a degree of a wavelength of the laser light.

The first optical waveguide 21 shown in FIG. 1 has input ports 21-1*i*, 21-2*i*, and 21-3*i* to which visible light is input from three visible laser light sources of red (R), green (G), and blue (B) on a surface 20B and has a red light input path 21-1 along which red laser light entering the input port 21-1*i* propagates, and a green light input path 21-2 along which green laser light entering the input port 21-2*i* propagates, and a blue light input path 21-3 along which blue laser light entering the input port 21-3*i* propagates. The first optical waveguide 21 further includes a multiplexing part 21*g*1 that multiplexes light propagating along the red light input path 21-1 and light propagating along the green light input path 21-2, a waveguide 21-12 in which the multiplexed light propagates, a multiplexing part 21*g*2 that multiplexes the light propagating in the waveguide 21-12 and light propagating along the blue light input path 21-3, an output path 21-123 along which the light multiplexed by the multiplexing part 21*g*2 propagates, and a visible light output port 21A connected to the output path 21-123.

The first optical waveguide 21 shown in FIG. 1 is an example, and other configurations may be adopted as long as the optical waveguide propagates light between the input port to which light is input from the visible laser light source and the visible light output port from which light is output.

For example, a configuration including an optical waveguide that propagates one or two types of laser light instead of three types of laser light of red (R), green (G), and blue (B) or a configuration including an optical waveguide in which a plurality of sets of types of laser light of red (R), green (G) and blue (B) propagate instead of an optical waveguide in which one set of types of laser light of red (R), green (G) and blue (B) propagates may be adopted.

In the case where the optical waveguide detection element according to the present embodiment is applied to a video laser module having an eye tracking mechanism to be described below, it is preferable that the number of visible light output ports be one from the viewpoint of optical axis alignment, but a configuration in which there are a plurality of visible light output ports can be used.

Although the first optical waveguide 21 shown in FIG. 1 has a configuration in which all input ports are arranged on the surface 20B opposite the one end surface 20A on which the visible light output port 21A, the near-infrared light output port 22A and the reflected light input port 23A are arranged in the X-direction, a configuration in which all or some input ports are arranged on a surface 20C or 20D may be adopted.

Although the multiplexing part may be any one selected from the group consisting of a multi-mode interferometer (MMI)-type multiplexing part (see FIGS. 3A and 3B), a Y-shaped multiplexing part (see FIG. 3C), and a directional coupler (see FIG. 3D), the MMI-type multiplexing part is preferred. The action of each multiplexing part will be described with reference to the drawings.

Figure 3A:
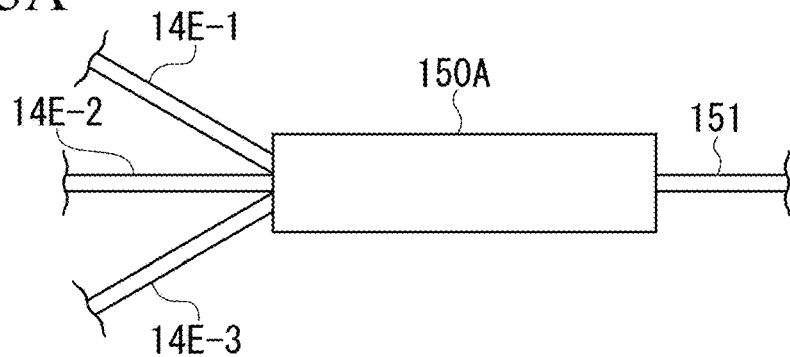
FIG. 3A is a diagram showing an example of an MMI-type multiplexing part which is an example of a multiplexing part.

The multiplexing part 150A shown in FIG. 3A is a multiplexing part 150 that multiplexes light propagating in the optical waveguide 14E-1, light propagating in the optical waveguide 14E-2, and light propagating in the optical waveguide 14E-3, and the multiplexed light is output from the multiplexing part 150 to the output waveguide 151.

Figure 3B:
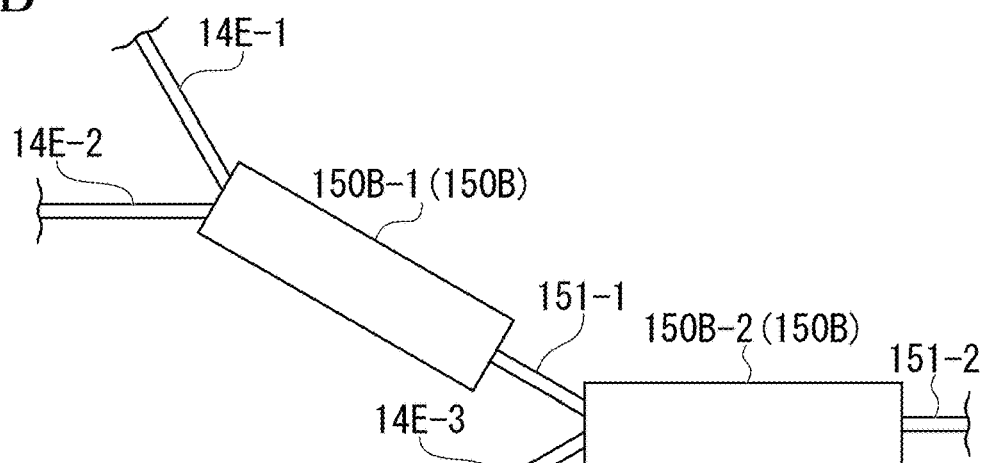
FIG. 3B is a diagram showing another example of the MMI-type multiplexing part which is an example of a multiplexing part.

Also, the multiplexing part 150B shown in FIG. 3B includes a multiplexing part 150B-1 that first multiplexes light propagating in the optical waveguide 14E-1 and light propagating in the optical waveguide 14E-2 and a multiplexing part 150B-2 that subsequently multiplexes light 151-1 obtained by outputting and propagating the multiplexed light from the multiplexing part 150B-1 and light propagating in the optical waveguide 14E-3, and the multiplexed light is output from the multiplexing part 150B-2 to the output waveguide 151-2.

Figure 3C:
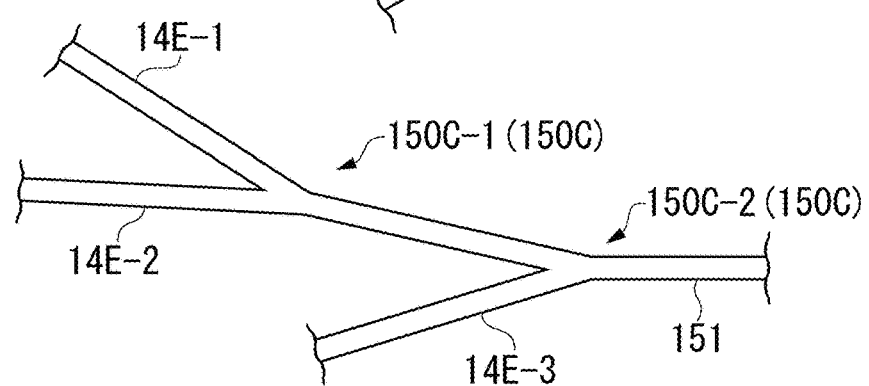
FIG. 3C is a diagram showing a Y-shaped multiplexing part which is an example of a multiplexing part.

Also, the multiplexing part 150C shown in FIG. 3C includes a multiplexing part 150C-1 that first multiplexes light propagating in the optical waveguide 14E-1 and light propagating in the optical waveguide 14E-2 and a multiplexing part 150C-2 that subsequently multiplexes light obtained by outputting and propagating the multiplexed light from the multiplexing part 150C-1 and light propagating in the optical waveguide 14E-3, and the multiplexed light is output from the multiplexing part 150C-2 to the output waveguide 151.

Figure 3D:
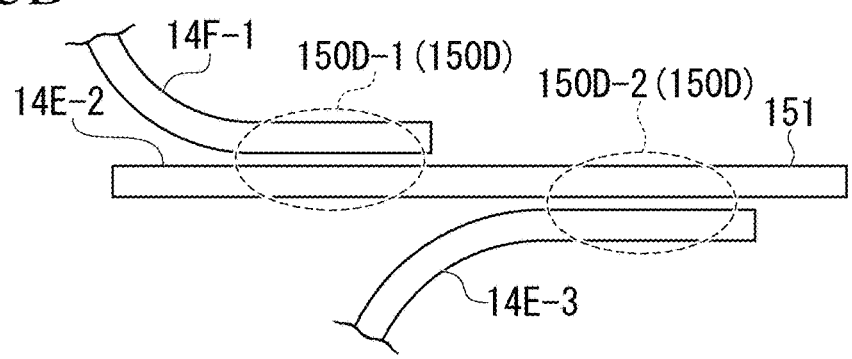
FIG. 3D is a diagram showing a directional coupler which is an example of a multiplexing part.

Also, the multiplexing part 150D shown in FIG. 3D includes a directional coupling part 150D-1 in which light propagating in the optical waveguide 14E-1 is first coupled to light propagating in the optical waveguide 14E-2 and a directional coupling part 150D-2 in which light propagating in the optical waveguide 14E-3 is subsequently coupled to the multiplexed light, and the coupled multiplexed light is output from the directional coupling part 150D-2 to the output waveguide 151.

The second optical waveguide 22 shown in FIG. 1 includes an input port 22*i* to which near-infrared light is input from a near-infrared laser light source, an optical waveguide in which near-infrared light input from the input port 22*i* propagates, and a near-infrared light output port 22A from which near-infrared light propagating in the optical waveguide is output.

The second optical waveguide 22 shown in FIG. 1 has only one input port on the assumption that light is input from one near-infrared laser light source. However, for example, in the case where an intensity of the near-infrared light emitted from one near-infrared laser light source is weak, a case where the intensity is not weak but is desired to be further increased, or the like, when near-infrared light is input from a plurality of near-infrared laser light sources, a configuration in which input ports equal in number to the near-infrared laser light sources are provided and a plurality of optical waveguides for propagating the near-infrared light from the input ports are coupled in one or more multiplexing parts to form one optical waveguide and light is output from the near-infrared light output port 22A may be adopted.

Although a configuration in which the input port 22$i$ is arranged on the surface 20B opposite the one end surface 20A on which the visible light output port 21A, the near-infrared light output port 22A, and the reflected light input port 23A are arranged in the X-direction in the second optical waveguide 22 shown in FIG. 1 is adopted, the input port 22$i$ may be arranged on the surface 20C or 20D.

The third optical waveguide 23 shown in FIG. 1 has a reflected light input port 23A to which near-infrared light is input that has been reflected and returned after the near-infrared light output from the near-infrared light output port 22A has been applied to the reflective object, an optical waveguide in which near-infrared light input from the reflected light input port 23A propagates, and a reflected light output port 22B from which the near-infrared light propagating in the optical waveguide is output.

Although a configuration in which the reflected light output port 22B is arranged on a surface 20C perpendicular to the one end surface 20A on which the visible light output port 21A, the near-infrared light output port 22A, and the reflected light input port 23A are arranged in the third optical waveguide 23 shown in FIG. 1 is adopted, the reflected light output port 22B may be arranged on the surface 20B or 20D in accordance with a position where the photodetector is arranged.

The one end surface 20A, the other end surface 20B, the surface 20C, and the surface 20D are four side surfaces of the optical waveguide layer 20 on the assumption that the surface 20D is opposite the surface 20C in the Y-direction, both the one end surface 20A and the other end surface 20B are surfaces parallel to the YZ-plane and facing each other in the X-direction and the surfaces 20C and 20D are surfaces parallel to the XZ-plane and facing each other in the Y-direction.

The optical waveguide detection element 100 shown in FIG. 1 has a configuration in which the visible light output port 21A, the near-infrared light output port 22A, and the reflected light input port 23A are arranged on one end surface 20A, the visible light laser input ports 21-1$i$, 21-2$i$, and 21-3$i$ and the far-infrared laser input port 22$i$ are arranged on the other end surface 20B opposite the one end surface 20A in the X-direction, and a reflected light output port 23B from which far-infrared light input from the reflected light input port 23A is output is arranged on the surface 20C orthogonal to one end surface 20A and the other end surface 20B. Although such a configuration is an example and a configuration in which the visible light output port 21A, the near-infrared light output port 22A, and the reflected light input port 23A are arranged on one end surface of the optical waveguide layer 20 is essential, each of the visible light laser input ports 21-1$i$, 21-2$i$, and 21-3$i$, the far-infrared laser input port 22$i$, and the reflected light output port 23B may be arranged on any one of three side surfaces, i.e., the other end surface 20B, the surface 20C, and the surface 20D, other than the one end surface 20A.

A center distance Da between the visible light output port 21A and the near-infrared light output port 22A shown in FIG. 2 is preferably 0 mm to 5 mm. The center distance Da is more preferably 0.3 mm to 3 mm, and further preferably 0.5 mm to 2 mm.

A center distance Db between the near-infrared light output port 22A and the reflected light input port 23A shown in FIG. 2 is preferably 0 mm to 5 mm. The center distance Db is more preferably 0.3 mm to 3 mm, and further preferably 0.5 mm to 2 mm.

Although examples of the photodetector 30 include a semiconductor detector using a pn junction of Si and a semiconductor detector using a pn junction of InGaAs, a spin photodetector in which a first ferromagnetic layer, a spacer layer, and a second ferromagnetic layer are laminated to have a magnetoresistance effect function is preferred.

The photodetector 30 preferably has light reception sensitivity to near-infrared light higher than that to visible light.

The optical waveguide detection element 100 shown in FIG. 1 has a support member 40 that supports the photodetector 30.

Figure 4A:
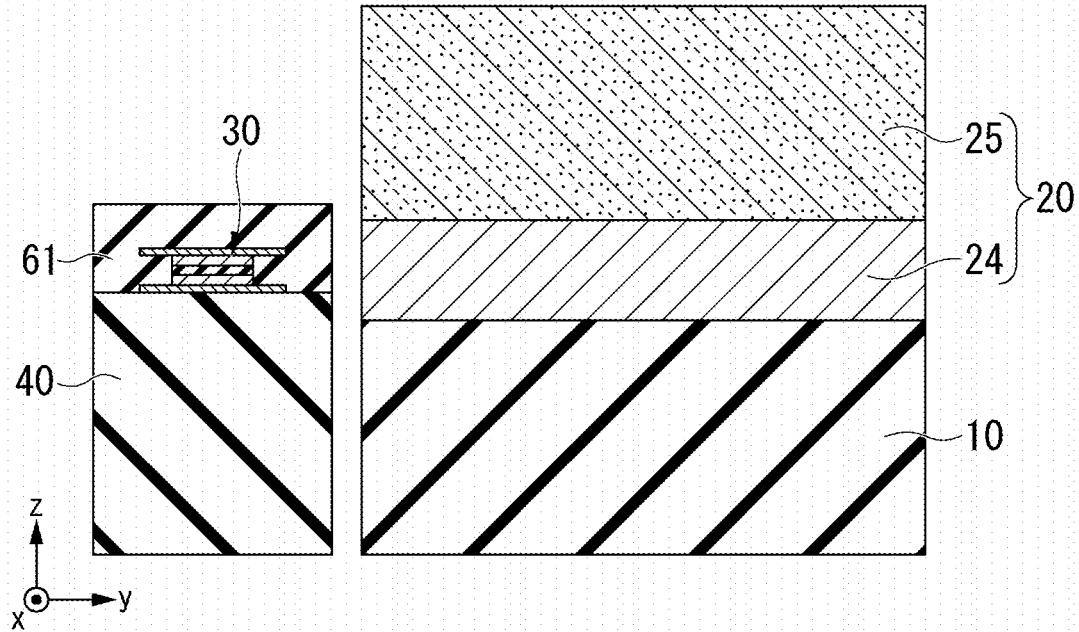
FIG. 4A is a schematic cross-sectional view along an XZ-plane of an example of a configuration of a photodetector and a support member.
Figure 4B:
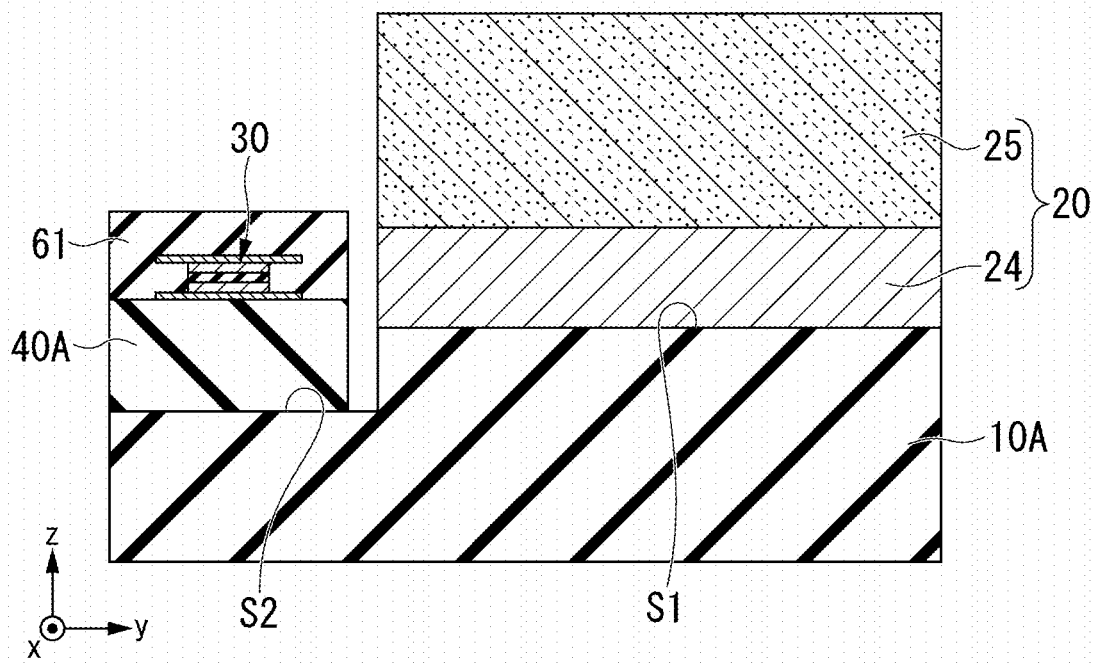
FIG. 4B is a schematic cross-sectional view along an XZ-plane of another example of the configuration of the photodetector and the support member.

FIGS. 4A and 4B are schematic cross-sectional views taken along the XZ-plane in two configuration examples of a photodetector and a support member. A case where a spin photodetector is used as the photodetector is shown.

In the example shown in FIG. 4A, the support member 40 is a member different from the substrate 10 on which the optical waveguide layer 20 is formed. The support member 40 and the substrate 10 are fixed on a common support body as an example. The support member 40 may be made of a material similar to or different from that of the substrate 10. In the example shown in FIG. 4A, the spin photodetector 30 is above or below the support member 40.

The spin photodetector 30 is located in the insulating layer 61 formed on the support member 40.

In the example shown in FIG. 4A, the height position of the spin photodetector 30 in the z-direction is aligned with the height position of the reflected light output port 23B of the third optical waveguide 23 in the z-direction. In this example, the spin photodetector 30, the optical waveguide layer 20, and the substrate 10 can be manufactured separately, and the restriction at the time of manufacturing is reduced.

In the example shown in FIG. 4B, the substrate 10A is different from the substrate 10 in that a step is formed on an upper surface thereof. The upper surface S1 on which the optical waveguide layer 20 is formed and the upper surface S2 including the support member 40 supporting the photodetector 30 have different height positions in the z-direction. The upper surface S1 is the upper surface of the substrate 10 at a position overlapping the optical waveguide layer 20 as seen from the z-direction. The optical waveguide layer 20 is formed on the upper surface Si. The upper surface S2 is the upper surface of the substrate 10A at a position overlapping the spin photodetector 30 as seen from the z-direction.

The support member 40A is placed on the upper surface S2. The spin photodetector 30 is formed above the substrate 10 and on the support member 40A.

As illustrated in FIGS. 4A and 4B, because the optical waveguide detection element 100 is manufactured by performing optical axis alignment for the light receiving surface of the photodetector 30 and the reflected light output port 23B of the third optical waveguide 23, optical axis alignment is substantially unnecessary.

Second Embodiment

Figure 5:
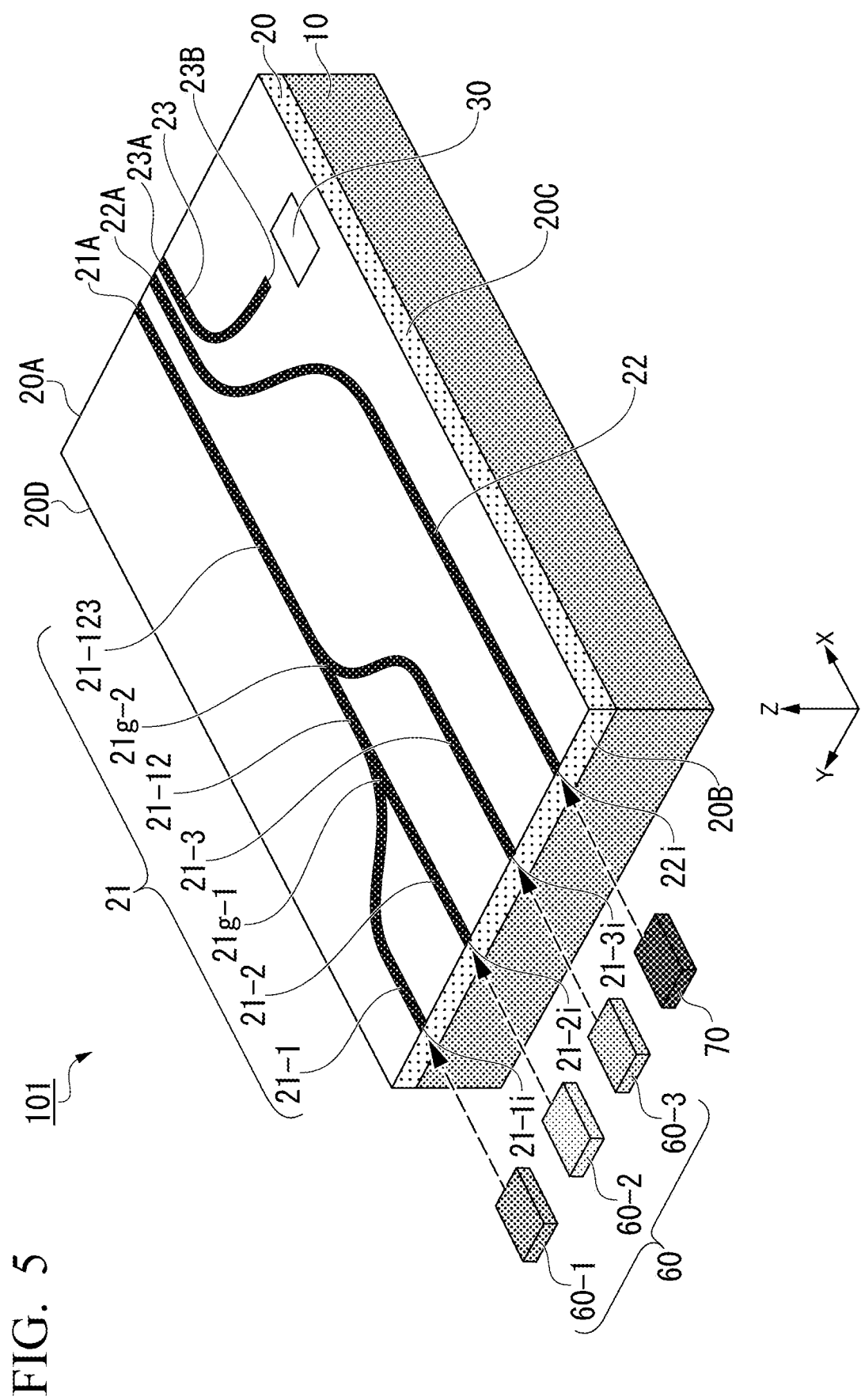
FIG. 5 is a schematic perspective view of an optical waveguide detection element according to a second embodiment.

FIG. 5 is a schematic perspective view of an optical waveguide detection element according to a second embodiment.

The optical waveguide detection element according to the second embodiment is different from the optical waveguide detection element according to the first embodiment in that a photodetector is formed in an optical waveguide layer.

Hereinafter, the same reference signs are used to denote members that are substantially the same as those described in the optical waveguide detection element according to the first embodiment and descriptions thereof may be omitted.

Figure 6:
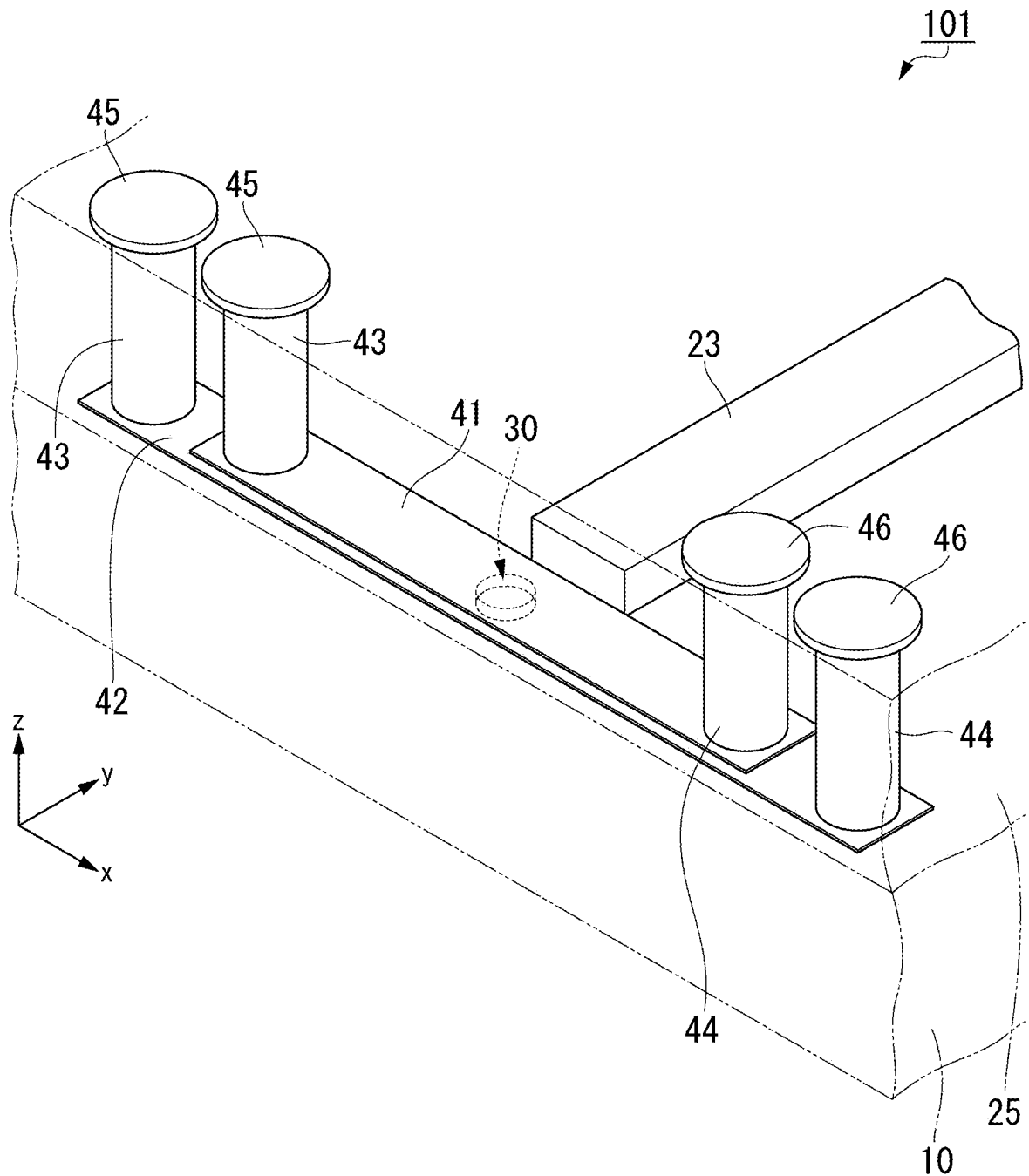
FIG. 6 is a schematic perspective view of a region surrounding a spin photodetector in a configuration in which the photodetector is the spin photodetector.
Figure 7:
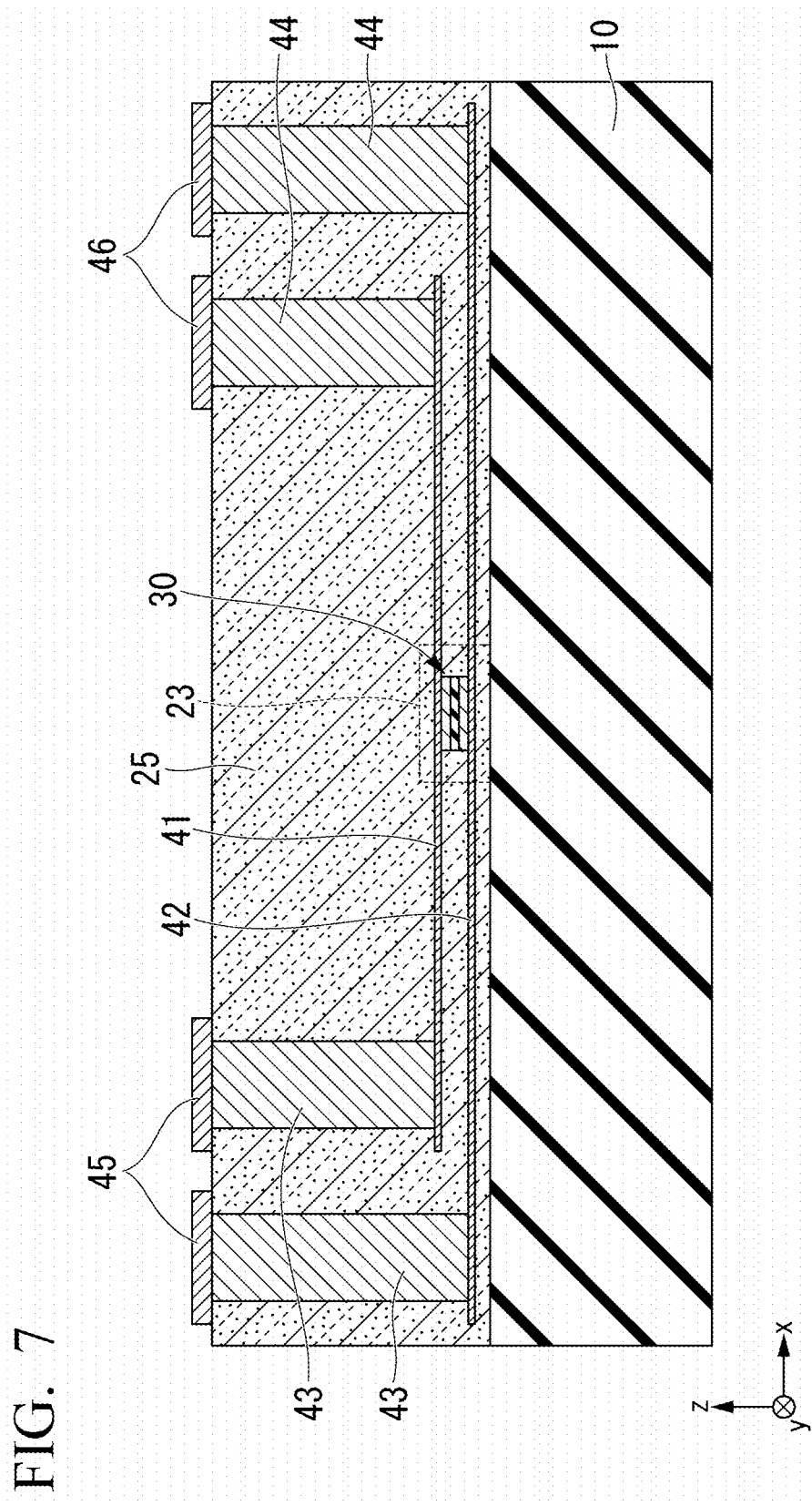
FIG. 7 is a schematic cross-sectional view of the region surrounding the spin photodetector in the configuration in which the photodetector is the spin photodetector.

In FIG. 6, a schematic perspective view of a region surrounding the spin photodetector of the optical waveguide detection element according to the second embodiment when the photodetector is a spin photodetector is shown. FIG. 7 is a cross-sectional view of a region surrounding the spin photodetector 30 of the optical waveguide detection element 101 according to the second embodiment.

The spin photodetector 30 is at a position where near-infrared light is applied. The spin photodetector 30 is located at the end of the output end of the third optical waveguide 23 as an example. The near-infrared light is applied from a direction intersecting a lamination direction of the spin photodetector 30 with respect to the spin photodetector 30 as an example. The near-infrared light is applied to the side surface of the spin photodetector 30 as an example. The spin photodetector 30 is formed on a substrate identical to the substrate 10 on which the optical waveguide layer 20 is formed. That is, the spin photodetector 30 and the optical waveguide layer 20 are incorporated into one article and cannot be separated. The spin photodetector 30 is located on the substrate 10 or above the substrate 10.

The spin photodetector 30 is electrically connected to electrodes 41 and 42, via wirings 43 and 44, input terminals 45, and output terminals 46 as an example.

The electrode 41 is connected to the first surface of the spin photodetector 30. The electrode 42 is connected to the second surface of the spin photodetector 30. The first surface and the second surface face each other in the lamination direction of the spin photodetector 30.

The electrodes 41 and 42 include a material having conductivity. Each of the electrodes 41 and 42 is made of, for example, a metal such as Cu, Al, Au or Ru. Ta or Ti may be laminated above and below these metals. Also, as the electrodes 41 and 42, a laminated film of Cu and Ta, a laminated film of Ta, Cu, and Ti, and a laminated film of Ta, Cu, and TaN may be used. Also, TiN or TaN may be used as the electrodes 41 and 42.

The electrodes 41 and 42 may have transparency to a wavelength range of light applied to the spin photodetector 30. For example, the electrodes 41 and 42 may be transparent electrodes including a transparent electrode material of an oxide such as indium tin oxide (ITO), indium zinc oxide (IZO), zinc oxide (ZnO), or indium gallium zinc oxide (IGZO). Also, the electrodes 41 and 42 may have a configuration having a plurality of columnar metals among the transparent electrode materials.

The via wiring 43 connects the input terminal 45 to the electrode 41 or the electrode 42. There are, for example, two input terminals 45. A current or voltage is input to one of the input terminals 45 and the other of the input terminals 45 is connected to a reference potential. The input terminal 45 is exposed, for example, on the upper surface of the cladding 28. The via wiring 44 connects the output terminal 46 to the electrode 41 or the electrode 42. There are, for example, two output terminals 46. A signal is output from one of the output terminals 46 and the other of the output terminals 46 is connected to the reference potential. The output terminal 46 is exposed, for example, on the upper surface of the cladding 28.

The via wirings 43 and 44, the input terminals 45, and the output terminals 46 include a material having conductivity. Materials identical to those cited as examples of the electrodes 41 and 42 can be used as the materials for the via wirings 43 and 44, the input terminals 45, and the output terminals 46.

Figure 8:
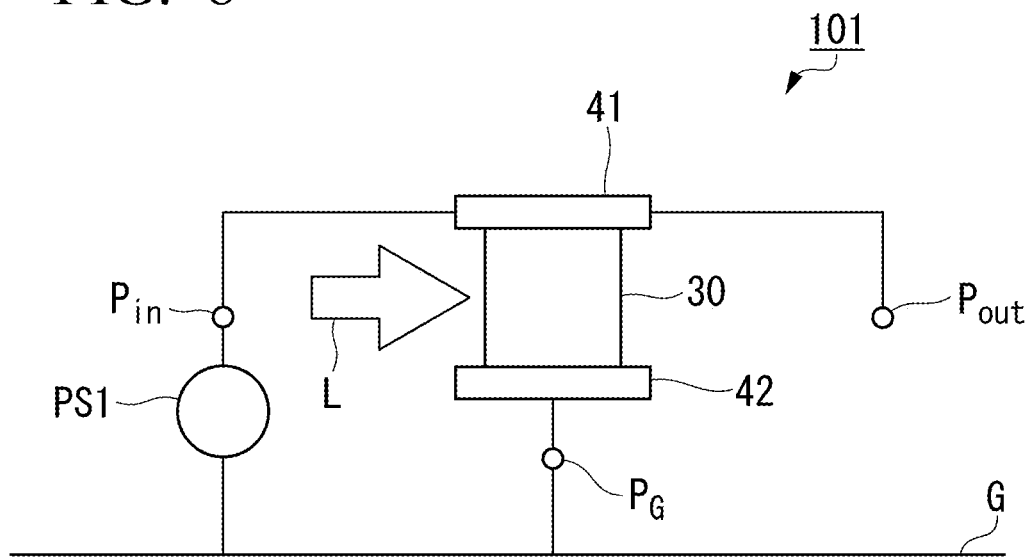
FIG. 8 is a diagram illustrating an example of a detection circuit in the configuration in which the photodetector is the spin photodetector.
Figure 9:
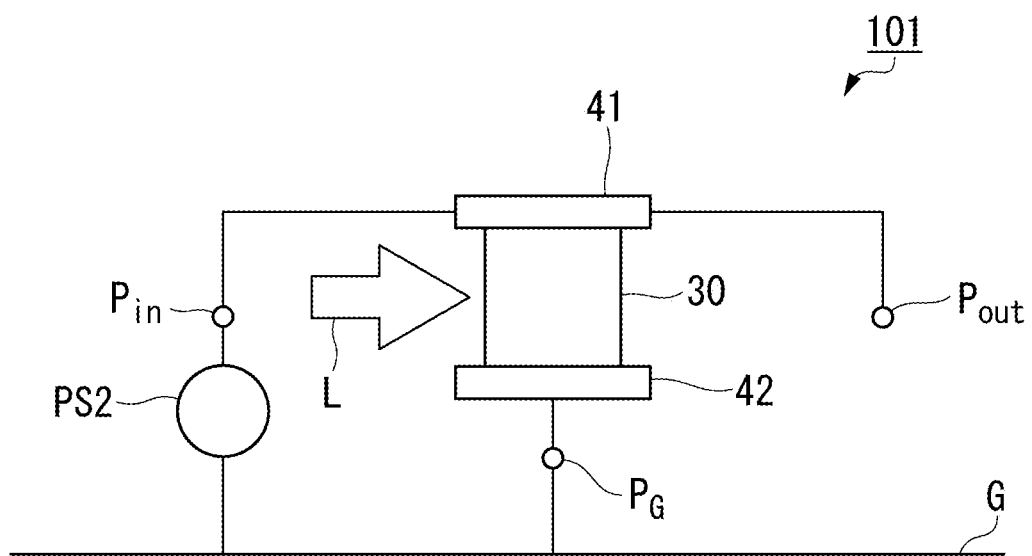
FIG. 9 is a diagram illustrating another example of the detection circuit in the configuration in which the photodetector is the spin photodetector.

FIGS. 8 and 9 are examples of light detection circuits using the spin photodetector 30 of the optical waveguide detection element 101 according to the first embodiment. In FIGS. 8 and 9, the electrode 41 is connected to an input terminal Pin and an output terminal Pout as an example. In FIGS. 8 and 9, the electrode 42 is connected to a reference potential terminal PG as an example. The input terminal Pin corresponds to one of the input terminals 45 in FIGS. 6 and 7. The output terminal Pout corresponds to one of the output terminals 46 in FIGS. 6 and 7. The reference potential terminal PG corresponds to the other of the input terminals 45 and the other of the output terminals 46 in FIGS. 6 and 7. The reference potential in FIGS. 8 and 9 is ground G.

The ground G may be provided outside of the optical waveguide detection element 101. The reference potential may be a potential other than the ground G.

The spin photodetector 30 replaces a change in the state of the applied light (the near-infrared light L) with an electrical signal. The output voltage or output current from the spin photodetector 30 varies with the intensity of the applied light (the near-infrared light L).

The input terminal Pin is connected to a current source PS1 or a voltage source PS2. The current source PS1 and the voltage source PS2 may be located outside of the optical waveguide detection element 101. In the case where the input terminal Pin is connected to the current source PS1, the output terminal Pout outputs the resistance value in the lamination direction of the spin photodetector 30 as a voltage. In the case where the input terminal Pin is connected to the voltage source PS2, the output terminal Pout outputs the resistance value in the lamination direction of the spin photodetector 30 as a current. In the case where it is not necessary to externally apply a current or voltage to the spin photodetector 30, the input terminal Pin and the current source PS1 or voltage source PS2 may be omitted.

Figure 10:
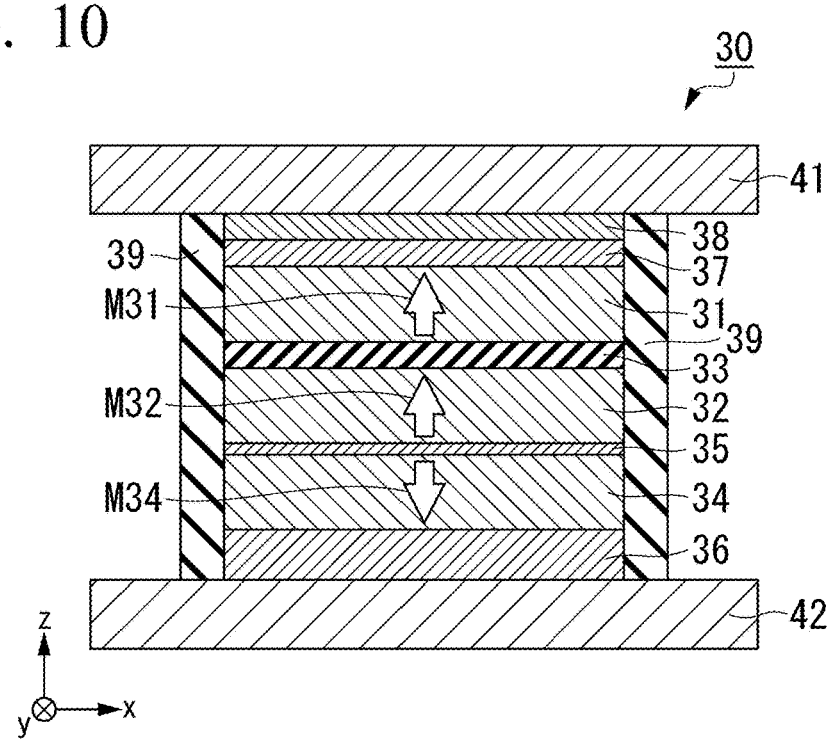
FIG. 10 is a schematic cross-sectional view of the region surrounding the spin photodetector in the configuration in which the photodetector is the spin photodetector.

FIG. 10 is a cross-sectional view of the spin photodetector 30 according to the first embodiment. In FIG. 10, the electrodes 41 and 42 are shown simultaneously and a direction of magnetization in the initial state of a ferromagnetic material is indicated by an arrow.

The spin photodetector 30 includes at least a first ferromagnetic layer 31, a second ferromagnetic layer 32, and a spacer layer 33. The spacer layer 33 is located between the first ferromagnetic layer 31 and the second ferromagnetic layer 32.

In addition to these, the spin photodetector 30 may include a third ferromagnetic layer 34, a magnetic coupling layer 35, a base layer 36, a perpendicular magnetization inducing layer 37, a cap layer 38, a sidewall insulating layer 39, and the like.

The spin photodetector 30 has the longest width when viewed from above in the lamination direction, for example, 2000 nm or less. The spin photodetector 30 has the longest width when viewed from above in the lamination direction, for example, 10 nm or more.

The spin photodetector 30 is, for example, a magnetic tunnel junction (MTJ) element in which the spacer layer 33 is composed of an insulating material. In this case, in the spin photodetector 30, the resistance value in the lamination direction (a resistance value when a current flows in the lamination direction) varies with a relative change between the state of the magnetization M31 of the first ferromagnetic layer 31 and the state of the magnetization M32 of the second ferromagnetic layer 32. Such an element is also referred to as a magnetoresistance effect element.

The first ferromagnetic layer 31 is a light detection layer whose magnetization state changes when external light is applied. The first ferromagnetic layer 31 is also referred to as a magnetization free layer. The magnetization free layer is a layer containing a magnetic material whose magnetization state changes when prescribed external energy has been applied. The prescribed external energy is, for example, externally applied light (near-infrared light L), a current flowing in the lamination direction of the spin photodetector 30, or an external magnetic field. The state of the magnetization M31 of the first ferromagnetic layer 31 varies with the intensity of the light (near-infrared light L) applied to the first ferromagnetic layer 31.

The first ferromagnetic layer 31 includes a ferromagnetic material. The first ferromagnetic layer 31 includes, for example, at least one of magnetic elements such as Co, Fe, and Ni. The first ferromagnetic layer 31 may include a nonmagnetic element such as B, Mg, Hf, or Gd together with the above-described magnetic element. The first ferromagnetic layer 31 may be, for example, an alloy including a magnetic element and a nonmagnetic element. The first ferromagnetic layer 31 may include a plurality of layers. The first ferromagnetic layer 31 is, for example, a CoFeB alloy, a laminate in which a CoFeB alloy layer is sandwiched between Fe layers, and a laminate in which a CoFeB alloy layer is sandwiched between CoFe layers.

The first ferromagnetic layer 31 may be an in-plane magnetization film having an axis of easy magnetization in the film in-plane direction or a perpendicular magnetization film having an axis of easy magnetization in a direction perpendicular to the film plane (the lamination direction of the spin photodetector 30).

A thickness of the first ferromagnetic layer 31 is, for example, 1 nm or more and 5 nm or less. The thickness of the first ferromagnetic layer 31 is preferably, for example, 1 nm or more and 2 nm or less. If the thickness of the first ferromagnetic layer 31 is thin when the first ferromagnetic layer 31 is a perpendicular magnetization film, the effect of applying perpendicular magnetic anisotropy from the layers above and below the first ferromagnetic layer 31 is strengthened and perpendicular magnetic anisotropy of the first ferromagnetic layer 31 increases. That is, when the perpendicular magnetic anisotropy of the first ferromagnetic layer 31 increases, a force for the magnetization M31 to return in the z-direction is strengthened. On the other hand, when the thickness of the first ferromagnetic layer 31 is thick, the effect of applying the perpendicular magnetic anisotropy from the layers above and below the first ferromagnetic layer 31 is relatively weakened and the perpendicular magnetic anisotropy of the first ferromagnetic layer 31 is weakened.

The volume of a ferromagnet becomes small when the thickness of the first ferromagnetic layer 31 becomes thin. The volume of a ferromagnet becomes large when the thickness of the first ferromagnetic layer 31 becomes thick. The susceptibility of the magnetization M31 of the first ferromagnetic layer 31 when external energy has been applied is inversely proportional to a product (KuV) of the magnetic anisotropy (Ku) and the volume (V) of the first ferromagnetic layer 31. That is, when the product of the magnetic anisotropy and the volume of the first ferromagnetic layer 31 becomes small, the reactivity to light increases. From this point of view, it is preferable to appropriately design the magnetic anisotropy of the first ferromagnetic layer 31 and then reduce the volume of the first ferromagnetic layer 31 so that the reaction to light increases.

When the thickness of the first ferromagnetic layer 31 is thicker than 2 nm, an insertion layer made of, for example, Mo and W may be provided within the first ferromagnetic layer 31. That is, the first ferromagnetic layer 31 may be a laminate in which the ferromagnetic layer, the insertion layer, and the ferromagnetic layer are laminated in that order. Interfacial magnetic anisotropy at an interface between the insertion layer and the ferromagnetic layer enhances the perpendicular magnetic anisotropy of the entire first ferromagnetic layer 31. A thickness of the insertion layer is, for example, 0.1 nm to 0.6 nm.

The second ferromagnetic layer 32 is a magnetization fixed layer. The magnetization fixed layer is a layer made of a magnet whose magnetization state is less likely to change than that of the magnetization free layer when prescribed external energy has been applied.

For example, in the magnetization fixed layer, a direction of magnetization is less likely to change than that in the magnetization free layer when prescribed external energy has been applied. Also, for example, in the magnetization fixed layer, a magnitude of magnetization is less likely to change than that in the magnetization free layer when prescribed external energy is applied. For example, a coercivity of the second ferromagnetic layer 32 is greater than that of the first ferromagnetic layer 31. The second ferromagnetic layer 32 has an axis of easy magnetization in the same direction as the first ferromagnetic layer 31. The second ferromagnetic layer 32 may be either an in-plane magnetization film or a perpendicular magnetization film.

For example, the material constituting the second ferromagnetic layer 32 is similar to that of the first ferromagnetic layer 31. The second ferromagnetic layer 2 may be, for example, a laminate in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are laminated in that order.

The magnetization M32 of the second ferromagnetic layer 32 may be fixed, for example, through magnetic coupling with the third ferromagnetic layer 34 in a state in which the magnetic coupling layer 35 is sandwiched between the second ferromagnetic layer 32 and the third ferromagnetic layer 34. In this case, a combination of the second ferromagnetic layer 32, the magnetic coupling layer 35, and the third ferromagnetic layer 34 may be referred to as a magnetization fixed layer.

The third ferromagnetic layer 34 is magnetically coupled to, for example, the second ferromagnetic layer 32. The magnetic coupling is, for example, antiferromagnetic coupling and is caused by Ruderman-Kittel-Kasuya-Yosida (RKKY) interaction. The material constituting the third ferromagnetic layer 34 is, for example, similar to that of the first ferromagnetic layer 31. The magnetic coupling layer 35 is, for example, Ru, Ir, or the like.

The spacer layer 33 is a nonmagnetic layer arranged between the first ferromagnetic layer 31 and the second ferromagnetic layer 32. The spacer layer 33 is composed of a layer composed of an electrical conductor, an insulator, or a semiconductor or a layer including a current-carry point composed of a conductor in the insulator. A thickness of the spacer layer 33 can be adjusted in accordance with the orientation direction of the magnetization M31 of the first ferromagnetic layer 31 and the magnetization M32 of the second ferromagnetic layer 32 in the initial state to be described below.

For example, in the case where the spacer layer 33 is made of an insulator, the spin photodetector 30 has a magnetic tunnel junction (MTJ) consisting of the first ferromagnetic layer 31, the spacer layer 33, and the second ferromagnetic layer 32. This element is referred to as an MTJ element. In this case, the spin photodetector 30 can exhibit a tunnel magnetoresistance (TMR) effect. In the case where the spacer layer 33 is made of a metal, the spin photodetector 30 can exhibit a giant magnetoresistance (GMR) effect. This element is referred to as a GMR element. The spin photodetector 30 may be referred to as an MTJ element, a GMR element, or the like in accordance with a constituent material of the spacer layer 33, but is also generically referred to as a magnetoresistance effect element.

In the case where the spacer layer 33 is made of an insulating material, materials including aluminum oxide, magnesium oxide, titanium oxide, silicon oxide, and the like can be used in the spacer layer 33. Also, for the spacer layer 33, these insulating materials may include elements such as Al, B, Si, and Mg and magnetic elements such as Co, Fe, and Ni. A high magnetoresistance change rate can be obtained by adjusting the thickness of the spacer layer 33 so that a strong TMR effect is exhibited between the first ferromagnetic layer 31 and the second ferromagnetic layer 32. In order to use the TMR effect efficiently, the thickness of the spacer layer 33 may be about 0.5 to 5.0 nm or about 1.0 to 2.5 nm.

In the case where the spacer layer 33 is made of a nonmagnetic conductive material, a conductive material such as Cu, Ag, Au, or Ru can be used. In order to use the GMR effect efficiently, the thickness of the spacer layer 33 may be about 0.5 to 5.0 nm or about 2.0 to 3.0 nm.

In the case where the spacer layer 33 is made of a nonmagnetic semiconductor material, a material such as zinc oxide, indium oxide, tin oxide, germanium oxide, gallium oxide, or indium tin oxide (ITO) can be used. In this case, the thickness of the spacer layer 33 may be about 1.0 to 4.0 nm.

In the case where a layer including a current-carrying point made of a conductor within a nonmagnetic insulator is applied as the spacer layer 33, a structure may be formed to include a current-carrying point made of a nonmagnetic conductor of Cu, Au, Al, or the like within the nonmagnetic insulator made of aluminum oxide or magnesium oxide. Also, the conductor may be made of a magnetic element such as Co, Fe, or Ni. In this case, the thickness of the spacer layer 33 may be about 1.0 to 2.5 nm. The current-carrying point is, for example, a columnar body having a diameter of 1 nm or more and 5 nm or less when viewed from a direction perpendicular to a film surface.

The base layer 36 is located between the second ferromagnetic layer 32 and the electrode 42. The base layer 36 is a seed layer or a buffer layer. The seed layer increases the crystallinity of a layer laminated on the seed layer. The seed layer is, for example, Pt, Ru, Hf, Zr, or NiFeCr. A thickness of the seed layer is, for example, 1 nm or more and 5 nm or less. The buffer layer is a layer that mitigates the lattice mismatch between different crystals. The buffer layer is, for example, Ta, Ti, W, Zr, Hf, or a nitride of these elements. A thickness of the buffer layer is, for example, 1 nm or more and 5 5 nm or less.

The cap layer 38 is between the first ferromagnetic layer 31 and the electrode 41. The cap layer 38 prevents damage to the lower layer during the process and enhances the crystallinity of the lower layer during annealing. The thickness of the cap layer 38 is, for example, 3 nm or less, so that sufficient light is applied to the first ferromagnetic layer 31. The cap layer 38 is, for example, MgO, W, Mo, Ru, Ta, Cu, Cr, or a laminated film thereof.

The perpendicular magnetization inducing layer 37 is formed in the case where the first ferromagnetic layer 31 is a perpendicular magnetization film. The perpendicular magnetization inducing layer 37 is laminated on the first ferromagnetic layer 31. The perpendicular magnetization inducing layer 37 induces perpendicular magnetic anisotropy of the first ferromagnetic layer 31. The perpendicular magnetization inducing layer 37 is, for example, magnesium oxide, W, Ta, Mo, or the like. In the case where the perpendicular magnetization inducing layer 37 is magnesium oxide, it is preferable that magnesium oxide be oxygen-deficient to increase conductivity. A thickness of the perpendicular magnetization inducing layer 37 is, for example, 0.5 nm or more and 2.0 nm or less.

The sidewall insulating layer 39 covers the perimeter of the laminate including the first ferromagnetic layer 31 and the second ferromagnetic layer 32. The sidewall insulating layer 39 is, for example, an oxide, nitride, or oxynitride of Si, Al, and Mg.

The spin photodetector 30 is produced by a lamination step, an annealing step, and a processing step for each layer. First, on the substrate 10 (on a part of the cladding 28), the electrode 42, the base layer 36, the third ferromagnetic layer 34, the magnetic coupling layer 35, the second ferromagnetic layer 32, the spacer layer 33, the first ferromagnetic layer 31, the perpendicular magnetization inducing layer 37, and the cap layer 38 are laminated in that order. The substrate 10 is the same as the substrate on which the optical waveguide layer 20 is formed. Each layer is deposited by, for example, sputtering.

Subsequently, the laminated film is annealed. The annealing temperature is, for example, in a range of 250° C. to 450° C. Subsequently, the laminated film is processed into a prescribed columnar body by photolithography and etching. The columnar body may be a cylindrical or a prismatic body. For example, a shortest width of the columnar body when viewed from the lamination direction may be 10 nm or more and 2000 nm or less, or 30 nm or more and 500 nm or less.

Subsequently, an insulating layer is formed to cover the side surface of the columnar body. The insulating layer is the sidewall insulating layer 39. The sidewall insulating layer 39 may be laminated a plurality of times. Subsequently, the upper surface of the cap layer 38 is exposed from the sidewall insulating layer 39 by chemical-mechanical polishing (CMP) and the electrode 41 is produced on the cap layer 38. By the above-described steps, the spin photodetector 30 is obtained. The spin photodetector 30 can be produced regardless of the material constituting the base. Therefore, the spin photodetector 30 can be produced directly on the substrate 10 on which the optical waveguide layer 20 is formed without an adhesive layer or the like interposed therebetween. The spin photodetector 30 can be formed in a process on the same substrate 10 together with the optical waveguide layer 20. For example, the optical waveguide layer 20 and the spin photodetector 30 can be formed on the same substrate 10 in a vacuum film formation process.

Figure 11:
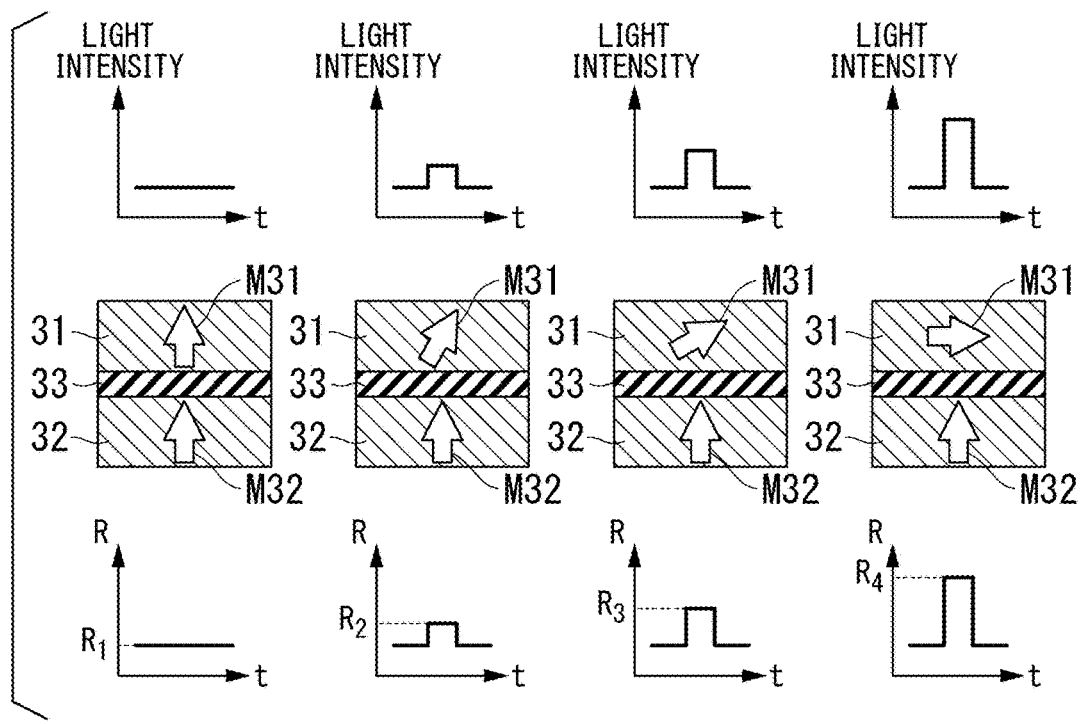
FIG. 11 is a diagram for describing a first mechanism of the spin photodetector.

FIG. 11 is a diagram for describing a first mechanism of an operation of the spin photodetector 30. In the upper graphs of FIG. 11, the vertical axis represents an intensity of light applied to the first ferromagnetic layer 31 and the horizontal axis represents time. In the lower graphs of FIG.

11, the vertical axis represents a resistance value of the spin photodetector 30 in the lamination direction and the horizontal axis represents time.

First, in a state in which light of the first intensity is applied to the first ferromagnetic layer 31 (hereinafter referred to as an initial state), the magnetization M31 of the first ferromagnetic layer 31 and the magnetization M32 of the second ferromagnetic layer 32 are in a parallel relationship. The resistance value of the spin photodetector 30 in the lamination direction is a first resistance value R1 and a magnitude of the output voltage or output current from the spin photodetector 30 has a first value. The first intensity may be an intensity of a case where the intensity of light applied to the first ferromagnetic layer 31 is zero.

For example, when a sense current is allowed to flow in the lamination direction of the spin photodetector 30, a voltage is generated between both ends of the spin photodetector 30 in the lamination direction and a resistance value of the spin photodetector 30 in the lamination direction is obtained from a voltage value using Ohm's law. The output voltage from the spin photodetector 30 is generated between the electrode 41 and the electrode 42. In the case of the example shown in FIG. 11, it is preferable to allow the sense current to flow from the first ferromagnetic layer 31 to the second ferromagnetic layer 32. By allowing the sense current to flow in this direction, spin transfer torque in the same direction as the magnetization M32 of the second ferromagnetic layer 32 acts on the magnetization M31 of the first ferromagnetic layer 31 and the magnetization M31 and the magnetization M32 are parallel in the initial state. Also, by allowing a sense current to flow in this direction, it is possible to prevent the magnetization M31 of the first ferromagnetic layer 31 from being inverted during operation.

Next, the intensity of the light applied to the first ferromagnetic layer 31 changes. The magnetization M31 of the first ferromagnetic layer 31 tilts from the initial state according to external energy due to light application. Both angles of a direction of the magnetization M31 of the first ferromagnetic layer 31 in a state in which light is not applied to the first ferromagnetic layer 31 and a direction of the magnetization M31 in a state in which light is applied to the first ferromagnetic layer 31 are greater than 0° and less than 90°.

When the magnetization M31 of the first ferromagnetic layer 31 tilts from the initial state, the resistance value of the magnetoresistance effect element 30 in the lamination direction changes. Also, the output voltage or output current from the spin photodetector 30 changes. For example, as the intensity of the light (near-infrared light L) applied to the spin photodetector 30 increases, the tilt of the magnetization M31 in the initial state increases. For example, in accordance with the tilt of the magnetization M31 of the first ferromagnetic layer 31, the resistance value of the spin photodetector 30 in the lamination direction changes to the second resistance value R2, the third resistance value R3, and the fourth resistance value R4 in that order and the output voltage or output current from the spin photodetector 30 changes to the second value, the third value, and the fourth value in that order. The resistance value increases in the order of the first resistance value R1, the second resistance value R2, the third resistance value R3, and the fourth resistance value R4. The output voltage from the spin photodetector 30 increases in the order of the first value, the second value, the third value, and the fourth value. In the case where the spin photodetector 30 is connected to a constant voltage source, the output current from the spin photodetector 30 decreases in the order of the first value, the second value, the third value, and the fourth value.

In the spin photodetector 30, the output voltage or output current from the spin photodetector 30 (the resistance value of the spin photodetector 30 in the lamination direction) changes when the intensity of the light (near-infrared light L) applied to the spin photodetector 30 changes. Therefore, the spin photodetector 30 can detect the intensity of the near-infrared light L as an output voltage or output current from the spin photodetector 30 (a resistance value of the spin photodetector 30).

Because spin transfer torque in the same direction as the magnetization M32 of the second ferromagnetic layer 32 acts on the magnetization M31 of the first ferromagnetic layer 31, the magnetization M31 tilted from the initial state returns to the initial state when the intensity of light applied to the first ferromagnetic layer 31 returns to the first intensity. When the magnetization M31 returns to the initial state, the resistance value of the spin photodetector 30 in the lamination direction returns to the first resistance value R1 and the output voltage or output current from the spin photodetector 30 returns to the first value.

A case where the magnetization M31 and the magnetization M32 are parallel in the initial state has been described as an example, but the magnetization M31 and the magnetization M32 may be antiparallel in the initial state. In this case, the resistance value of the spin photodetector 30 in the lamination direction decreases as the magnetization M31 tilts (or as the angle change from the initial state of the magnetization M31 increases). When a case where the magnetization M31 and the magnetization M32 are antiparallel is set as the initial state, the sense current preferably flows from the second ferromagnetic layer 32 toward the first ferromagnetic layer 31. By allowing a sense current to flow in this direction, spin transfer torque in a direction opposite that of the magnetization M32 of the second ferromagnetic layer 32 acts on the magnetization M31 of the first ferromagnetic layer 31 and the magnetization M31 and the magnetization M32 are antiparallel in the initial state.

Figure 12:
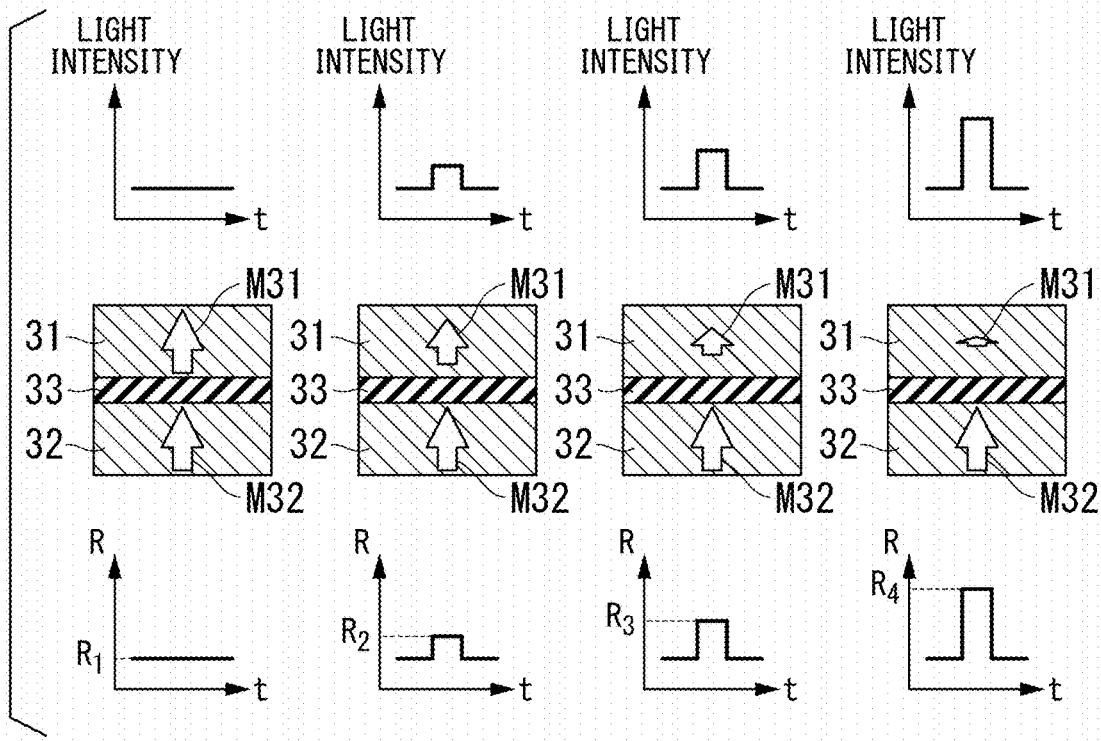
FIG. 12 is a diagram for describing a second mechanism of the spin photodetector.

FIG. 12 is a diagram for describing a second mechanism of the operation of the spin photodetector 30. In the upper graphs of FIG. 12, the vertical axis represents an intensity of light applied to the first ferromagnetic layer 31 and the horizontal axis represents time. In the lower graphs of FIG. 12, the vertical axis represents a resistance value of the spin photodetector 30 in the lamination direction and the horizontal axis represents time.

The initial state shown in FIG. 12 is similar to the initial state shown in FIG. 11. In the case of the example shown in FIG. 12, it is preferable to allow the sense current to flow from the first ferromagnetic layer 31 toward the second ferromagnetic layer 32. By allowing the sense current to flow in this direction, spin transfer torque in the same direction as the magnetization M32 of the second ferromagnetic layer 32 acts on the magnetization M31 of the first ferromagnetic layer 31 and the initial state is maintained.

Next, the intensity of the light (near-infrared light) applied to the first ferromagnetic layer 31 changes. According to external energy due to light application, a magnitude of the magnetization M31 of the first ferromagnetic layer 31 decreases from the initial state. When the magnetization M31 of the first ferromagnetic layer 31 decreases from the initial state, the resistance value of the magnetoresistance element 30 in the lamination direction changes. Also, the output voltage or output current from the spin photodetector 30 changes. For example, as the intensity of the light (near-infrared light L) applied to the spin photodetector 30 increases, the magnitude of the magnetization M31 decreases. For example, in accordance with a magnitude of the magnetization M31 of the first ferromagnetic layer 31, the resistance value of the spin photodetector 30 in the lamination direction changes to the second resistance value R2, the third resistance value R3, and the fourth resistance value R4 in that order and the output voltage or output current from the spin photodetector 30 changes to the second value, the third value, and the fourth value in that order. The resistance value increases in the order of the first resistance value R1, the second resistance value R2, the third resistance value R3, and the fourth resistance value R4. The output voltage from the spin photodetector 30 increases in the order of the first value, the second value, the third value, and the fourth value. In the case where the spin photodetector 30 is connected to a constant voltage source, the output current from the spin photodetector 30 decreases in the order of the first value, the second value, the third value, and the fourth value.

When the intensity of the light applied to the first ferromagnetic layer 31 returns to the first intensity, the magnitude of the magnetization M31 of the first ferromagnetic layer 31 is restored and the spin photodetector 30 returns to the initial state. That is, the resistance value of the spin photodetector 30 in the lamination direction returns to the first resistance value R1 and the output voltage or output current from the spin photodetector 30 returns to the first value.

In FIG. 12, the magnetization M31 and the magnetization M32 may also be antiparallel in the initial state.

In this case, the resistance value of the spin photodetector 30 in the lamination direction decreases as the magnitude of the magnetization M31 decreases. When a case where the magnetization M31 and the magnetization M32 are antiparallel is set as the initial state, the sense current preferably flows from the second ferromagnetic layer 32 toward the first ferromagnetic layer 31.

After the above-described procedure, the intensity of the light output from the laser diode 60-1 can be read as the output voltage or output current from the spin photodetector 30 (the resistance value of the spin photodetector 30 in the lamination direction). Also, in a similar procedure, the intensity of the light output from the laser diode 60-2 and the intensity of the light output from the laser diode 60-3 are sequentially measured.

Light output from the visible light output port 21A of the first optical waveguide 21 is a combination of light output from the laser diodes 60-1, 60-2, and 60-3. By adjusting intensities of light output from the laser diodes 60-1, 60-2, and 60-3, the white balance of output light from the optical waveguide detection element 101 can be adjusted. The intensities of the light output from the laser diodes 60-1, 60-2, and 60-3 can be adjusted, for example, by feeding back a measurement result of an output from the spin photodetector 30 to the laser diodes 60-1, 60-2, and 60-3.

Also, the magnetization M31 of the first ferromagnetic layer 31 is more likely to change due to light application when the volume of the first ferromagnetic layer 31 becomes smaller. That is, when the volume of the first ferromagnetic layer 31 becomes smaller, the magnetization M31 of the first ferromagnetic layer 31 is more likely to tilt due to light application or is more likely to become smaller due to light application. In other words, when the volume of the first ferromagnetic layer 31 is reduced, the magnetization M31 can also be changed with a low light intensity. That is, the spin photodetector 30 according to the first embodiment can detect light with high sensitivity.

More precisely, the variability of the magnetization M31 is determined by the magnitude of a product (KuV) of the magnetic anisotropy (Ku) and the volume (V) of the first ferromagnetic layer 31. The magnetization M31 also changes with a smaller light intensity as KuV decreases and the magnetization M31 does not change unless the light intensity is higher as KuV increases. That is, KuV of the first ferromagnetic layer 31 is designed in accordance with an intensity of externally applied light used in the application. When the detection of an extremely low light intensity is assumed, it is possible to detect light with a very low light intensity by reducing KuV of the first ferromagnetic layer 31. Such detection of light with a very low light intensity is a great advantage because it becomes difficult in a conventional pn junction semiconductor when the element size is reduced. By reducing the volume of the first ferromagnetic layer 31, KuV can be reduced.

As described above, the optical waveguide detection element 101 according to the second embodiment can read an intensity of light output from each of the laser diodes 60-1, 60-2, and 60-3 from the output voltage or output current of the spin photodetector 30 (the resistance value of the spin photodetector 30 in the lamination direction). The optical waveguide detection element 101 according to the second embodiment can adjust the white balance of light output from the visible light output port 21A of the first optical waveguide 21 by adjusting the intensity of the light output from each laser diode 60-1, 60-2, or 60-3.

Although the second embodiment has been described in detail with reference to the drawings as described above, the second embodiment is not limited to this example.

Figure 13:
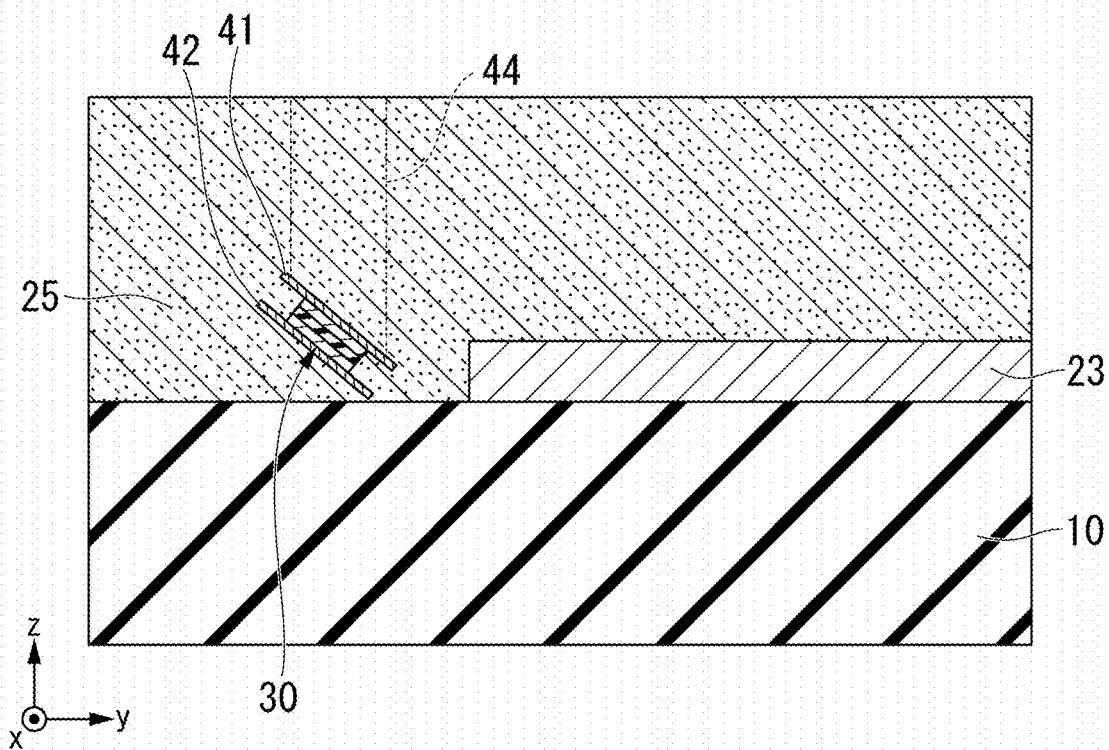
FIG. 13 is a schematic cross-sectional view of a region surrounding the spin photodetector in another arrangement example of the spin photodetector.

For example, as shown in FIG. 13, the lamination direction of the spin photodetector 30 may tilt with respect to the z-direction. In this case, near-infrared light is applied to the side surface of the spin photodetector 30 and the first surface on the electrode 41 side of the spin photodetector 30.

Third Embodiment

An optical waveguide detection element according to a third embodiment has a spin photodetector configuration different from that of the optical waveguide detection element according to the second embodiment.

Figure 14:
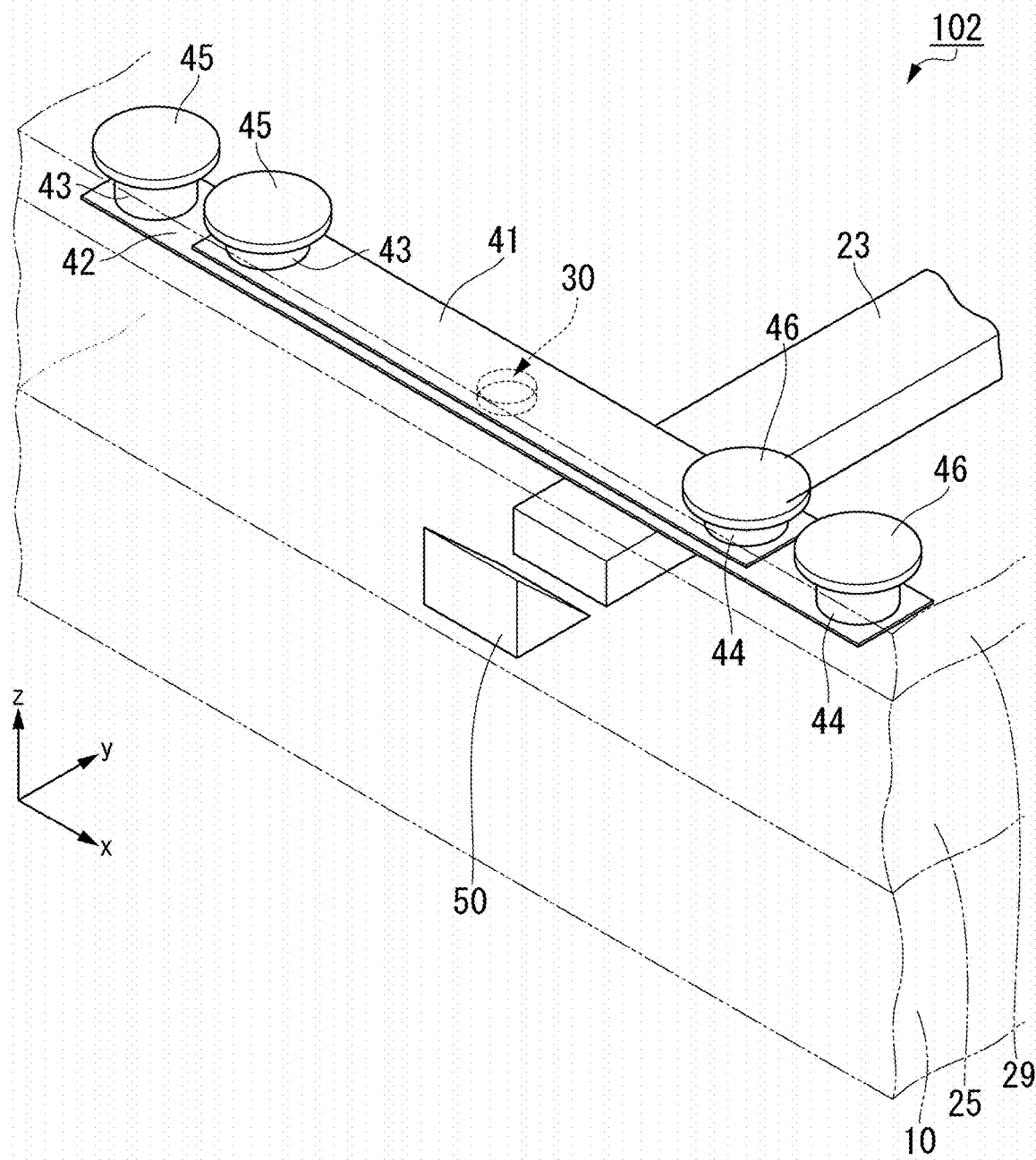
FIG. 14 is a schematic perspective view of a region surrounding a spin photodetector of an optical waveguide detection element according to a third embodiment.
Figure 15:
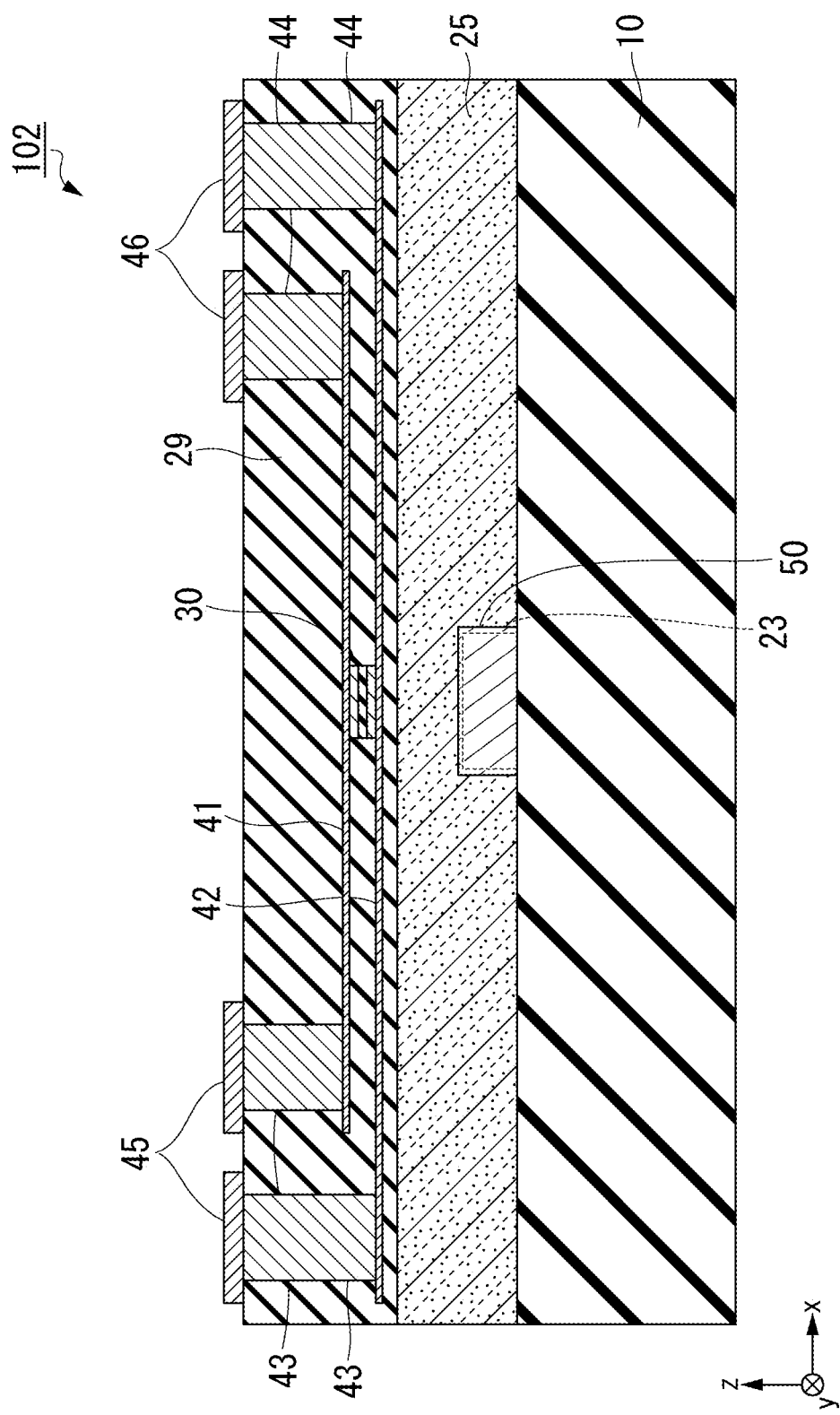
FIG. 15 is a schematic cross-sectional view along an XZ-plane of the region surrounding the spin photodetector of the optical waveguide detection element according to the third embodiment.
Figure 16:
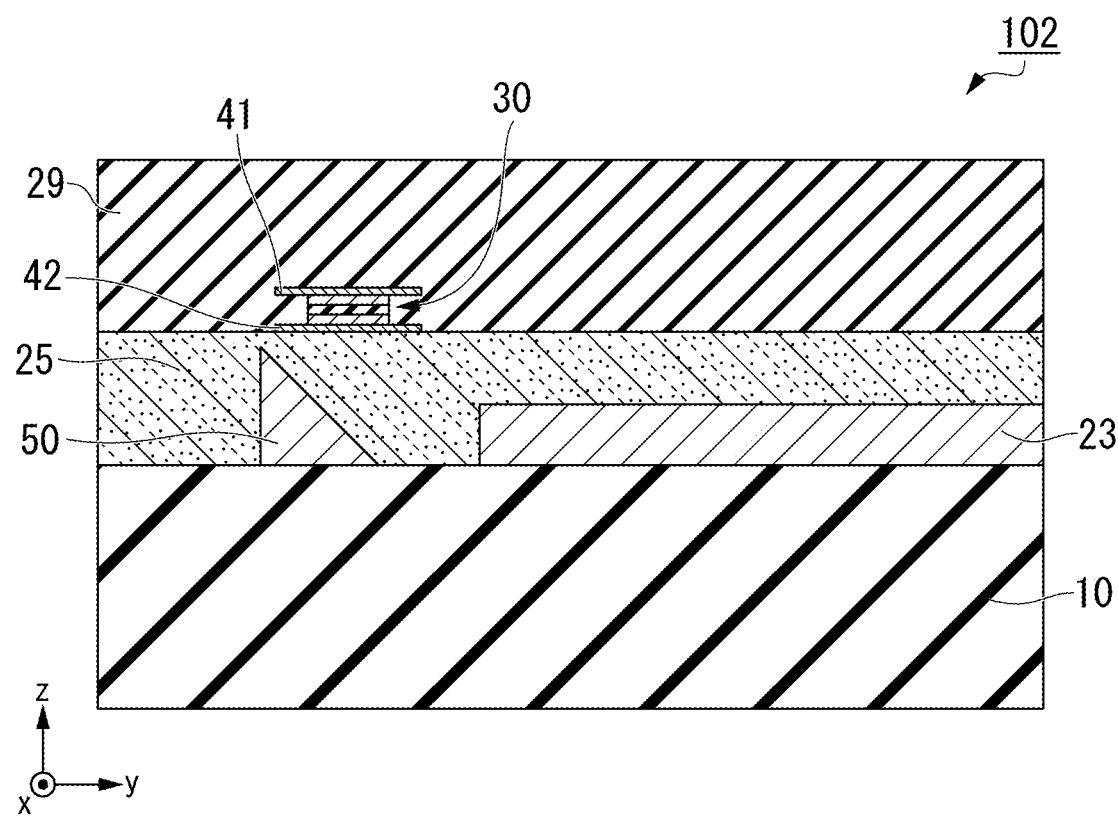
FIG. 16 is a schematic cross-sectional view along a YZ-plane of the region surrounding the spin photodetector of the optical waveguide detection element according to the third embodiment.

FIG. 14 is a perspective view of a region surrounding the spin photodetector 30 of the optical waveguide detection element 102 according to the third embodiment. FIG. 15 is a cross-sectional view of a region surrounding the spin photodetector 30 of the optical waveguide detection element 102 according to the third embodiment. FIG. 16 is another cross-sectional view of the region surrounding the spin photodetector 30 of the optical waveguide detection element 102 according to the third embodiment.

In the third embodiment, components similar to those of the first embodiment and the second embodiment are denoted by similar reference signs, and descriptions thereof are omitted.

The optical waveguide detection element 102 has a reflector 50. The reflector 50 reflects light (near-infrared light) output from the third optical waveguide 23 toward the spin photodetector 30. The reflector 50 is located at a position in a direction of traveling of near-infrared light from the output end of the third optical waveguide 23. The reflector 50 has a tilted surface tilted with respect to the direction of traveling of the near-infrared light.

The reflector 50 reflects light. The reflector 50 is, for example, a reflecting mirror.

The spin photodetector 30 is formed in the insulating layer 29 formed on the cladding 28. The insulating layer 29 has, for example, a material similar to that of the sidewall insulating layer 39. The spin photodetector 30 is located above the substrate 10. The spin photodetector 30 is located at a height different from that of the optical waveguide layer 20 and is located away from the substrate 10 as compared with the optical waveguide layer 20.

The spin photodetector 30 is located above the reflector 50 as an example.

The light (near-infrared light) reflected by the reflector 50 is applied to the spin photodetector 30 from the lamination direction of the spin photodetector 30 as an example. In this case, the electrode 42 has transparency to the wavelength range of light applied to the spin photodetector 30. When the electrode 42 transmits a part of the near-infrared light, the near-infrared light is applied to the spin photodetector 30. An example in which the electrode 42 is arranged closer to the reflector 50 side than the electrode 41 has been exemplified, but the electrode 41 may be arranged closer to the reflector 50 side than the electrode 42 (the first ferromagnetic layer 31 may be arranged closer to the reflector 50 side than the second ferromagnetic layer 32). In this case, the electrode 41 has transparency to the wavelength range of light applied to the spin photodetector 30. In the case where the electrode 41 is arranged closer to the reflector 50 side than the electrode 42, the efficiency of application of near-infrared light to the first ferromagnetic layer 31 increases.

The optical waveguide detection element 102 according to the third embodiment has similar effects to that of the optical waveguide detection element 101. Also, a direction of applying near-infrared light to the spin photodetector 30 can be freely designated by the reflector 50. For example, in the case where near-infrared light is applied to the spin photodetector 30 from the lamination direction, a light receiving area of the spin photodetector 30 can be widely secured.

Fourth Embodiment

Figure 17:
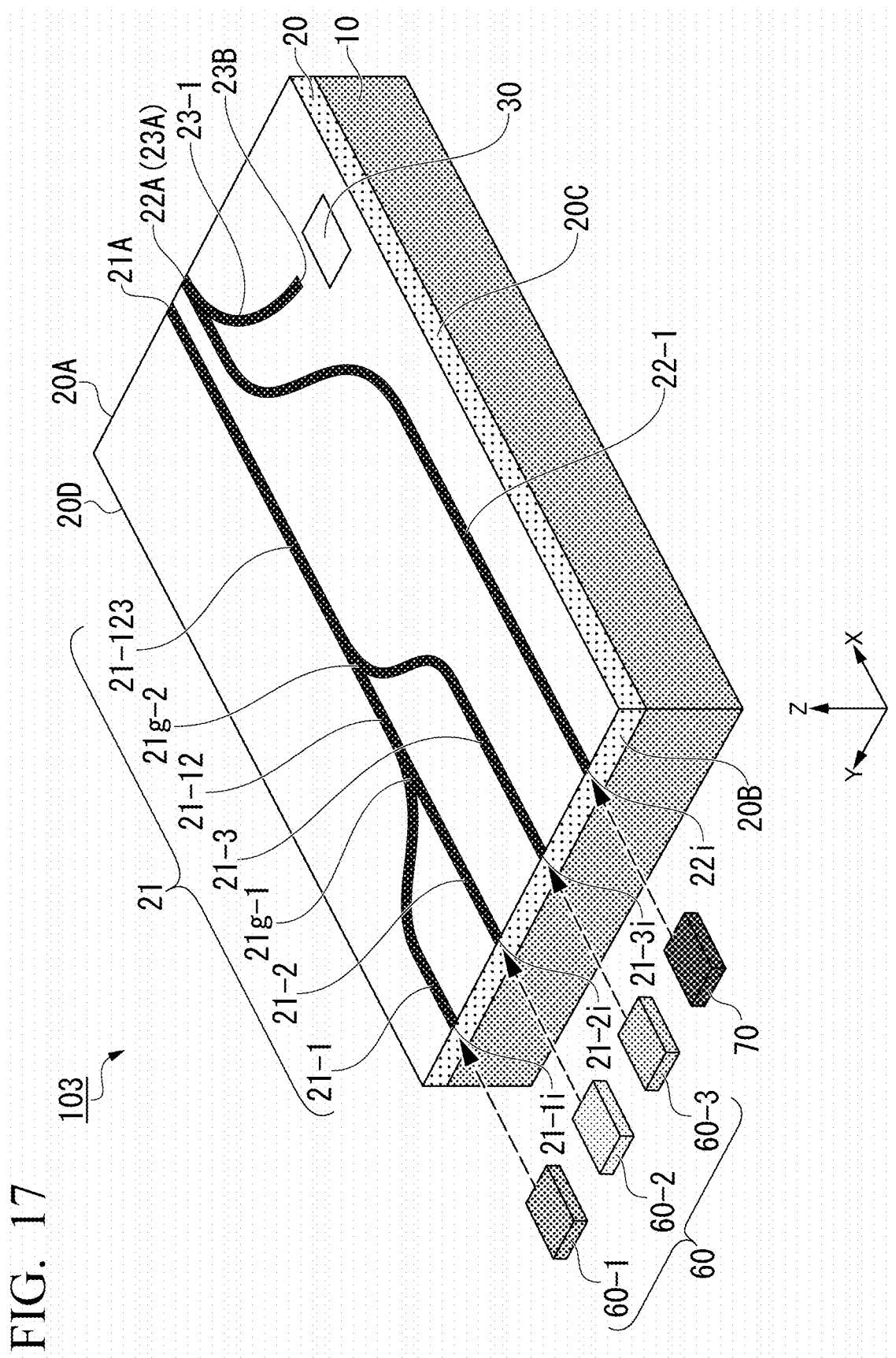
FIG. 17 is a schematic perspective view of an optical waveguide detection element according to a fourth embodiment.

FIG. 17 is a schematic perspective view of an optical waveguide detection element according to a fourth embodiment.

In the fourth embodiment, components similar to those of the first embodiment, the second embodiment, and the third embodiment are denoted by similar reference signs, and descriptions thereof are omitted.

The optical waveguide detection element 103 shown in FIG. 17 has a near-infrared light output port 22A and a reflected light input port 23A in common. That is, a second optical waveguide 22-1 and a third optical waveguide 23-1 are configured to merge in the vicinity of one end surface 20A of an optical waveguide layer 20 and have the common near-infrared light output port 22A (reflected light input port 23A). A configuration in which a center distance Db between the near-infrared light output port 22A and the reflected light input port 23A is zero is adopted.

In this configuration, in order to separate output light of near-infrared light and reflected input light of the near-infrared light, a backflow prevention mechanism may be provided so that the reflected light does not flow back to the laser element 70 in the second optical waveguide 22-1.

A configuration in which a part or all of the first optical waveguide 21 and the second optical waveguide 22 provided in the optical waveguide layer 20 of the above-described embodiment are Mach-Zehnder-type optical waveguides and include electrodes for applying a modulation voltage may be adopted. In this case, a modulation voltage Vm corresponding to the modulation signal is applied.

Video Laser Module

The video laser module according to the present embodiment includes an optical waveguide detection element according to the above-described embodiment, visible laser light sources equal in number to input ports of a first optical waveguide (visible light waveguide) provided in the optical waveguide detection element, and near-infrared laser light sources equal in number to input ports of a second optical waveguide (near-infrared light waveguide).

Using the video laser module according to the present embodiment, near-infrared light emitted from the near-infrared laser light source is applied to the eyes and the near-infrared light reflected from the eyes is detected by a photodetector provided in the optical waveguide detection element; and thereby, eye tracking (visual line tracking) is possible.

In the video laser module according to the present embodiment, because a visible light source module for a video and a near-infrared light source module for eye tracking are configured as one module, significant miniaturization can be implemented. Also, an optical axis alignment of the visible light source module for the video and the near-infrared light source module for the eye tracking is not required. Therefore, work efficiency is significantly improved when XR glasses in which the video laser module according to the present embodiment is mounted on glasses are manufactured.

First Embodiment

Figure 18:
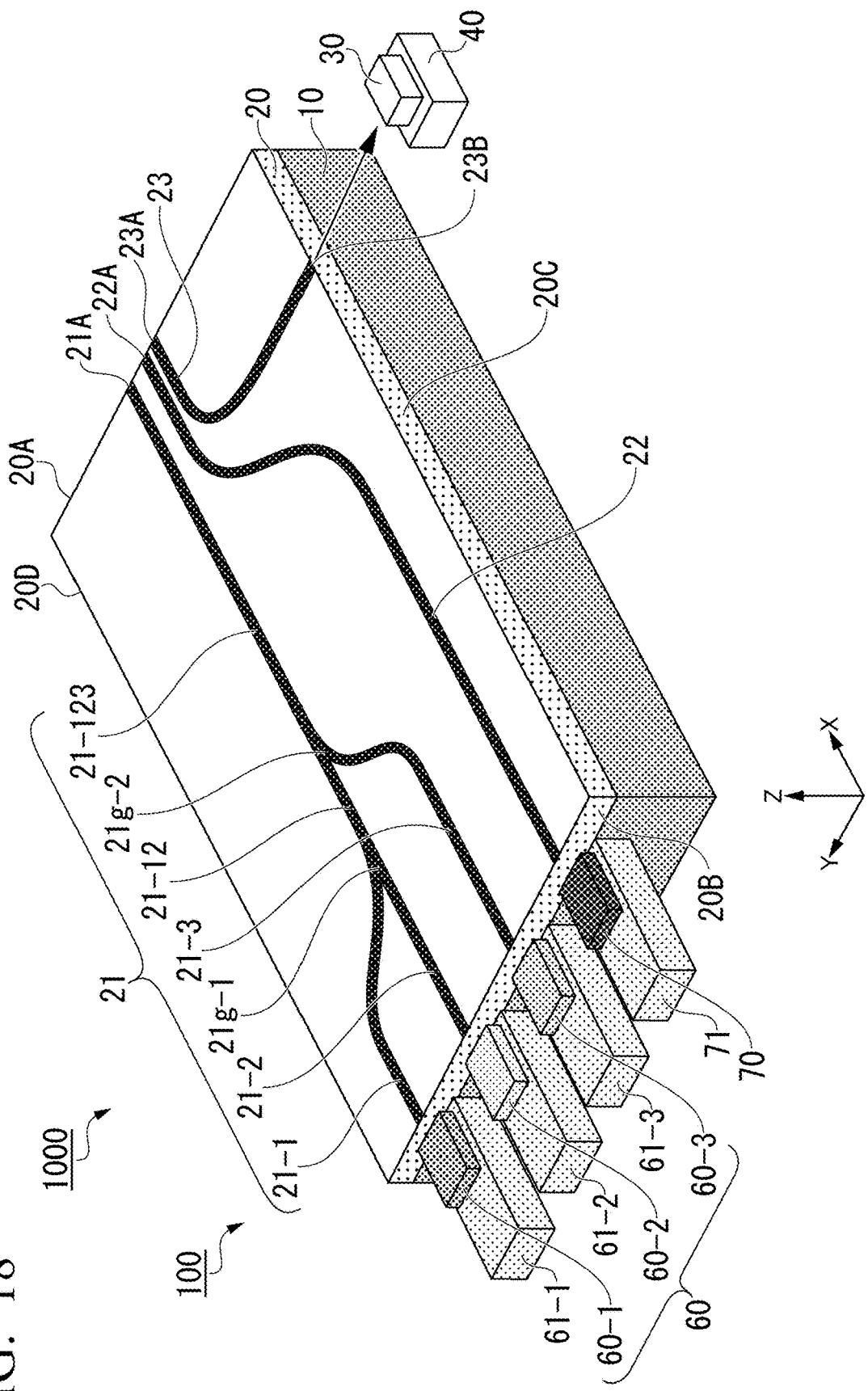
FIG. 18 is a schematic perspective view of a video laser module according to the first embodiment.

FIG. 18 is a schematic perspective view of a video laser module according to the first embodiment.

A video laser module 1000 shown in FIG. 18 includes the optical waveguide detection element 100 shown in FIG. 1; a red laser light source 60-1, a green laser light source 60-2, and a blue laser light source 60-3 configured to output visible light lasers to three input ports 21-1$i$, 21-2$i$, and 21-3$i$ of the first optical waveguide 21 provided in the optical waveguide detection element 100; and a near-infrared laser light source 70 configured to output a near-infrared light laser toward the input port 22$i$ of the second optical waveguide 22 provided in the optical waveguide detection element 100.

Each of the visible laser light source 60 and the near-infrared laser light source 70 is a laser diode (LD). The red laser light source 60-1 is, for example, a laser that outputs light in a wavelength range of 590 nm or more and 800 nm or less, the green laser light source 60-2 is, for example, a laser that outputs light in a wavelength range of 490 nm or more and less than 590 nm, the blue laser light source 60-3 is, for example, a laser that outputs light in a wavelength range of 380 nm or more and less than 490 nm, and the near-infrared laser light source 70 is, for example, a laser that outputs near-infrared light in a wavelength range of 780 nm to 2.0 μm.

The first optical waveguide (visible light waveguide) is optically connected to each of laser diodes (LDs) 60-1, 60-2, and 60-3. Also, the second optical waveguide (near-infrared optical waveguide) is optically connected to the laser diode 70.

The LDs 60-1, 60-2, 60-3, and 70 can be mounted on subcarriers 61-1, 61-2, 61-3, and 71, respectively, in, for example, a bare chip (an unpackaged chip). The subcarriers

Figure 19A:
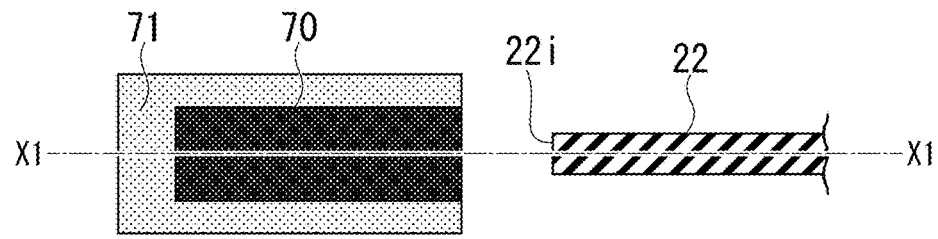
FIG. 19A is a schematic plan view obtained by enlarging a region surrounding a near-infrared laser light source and a second optical waveguide.
Figure 19B:
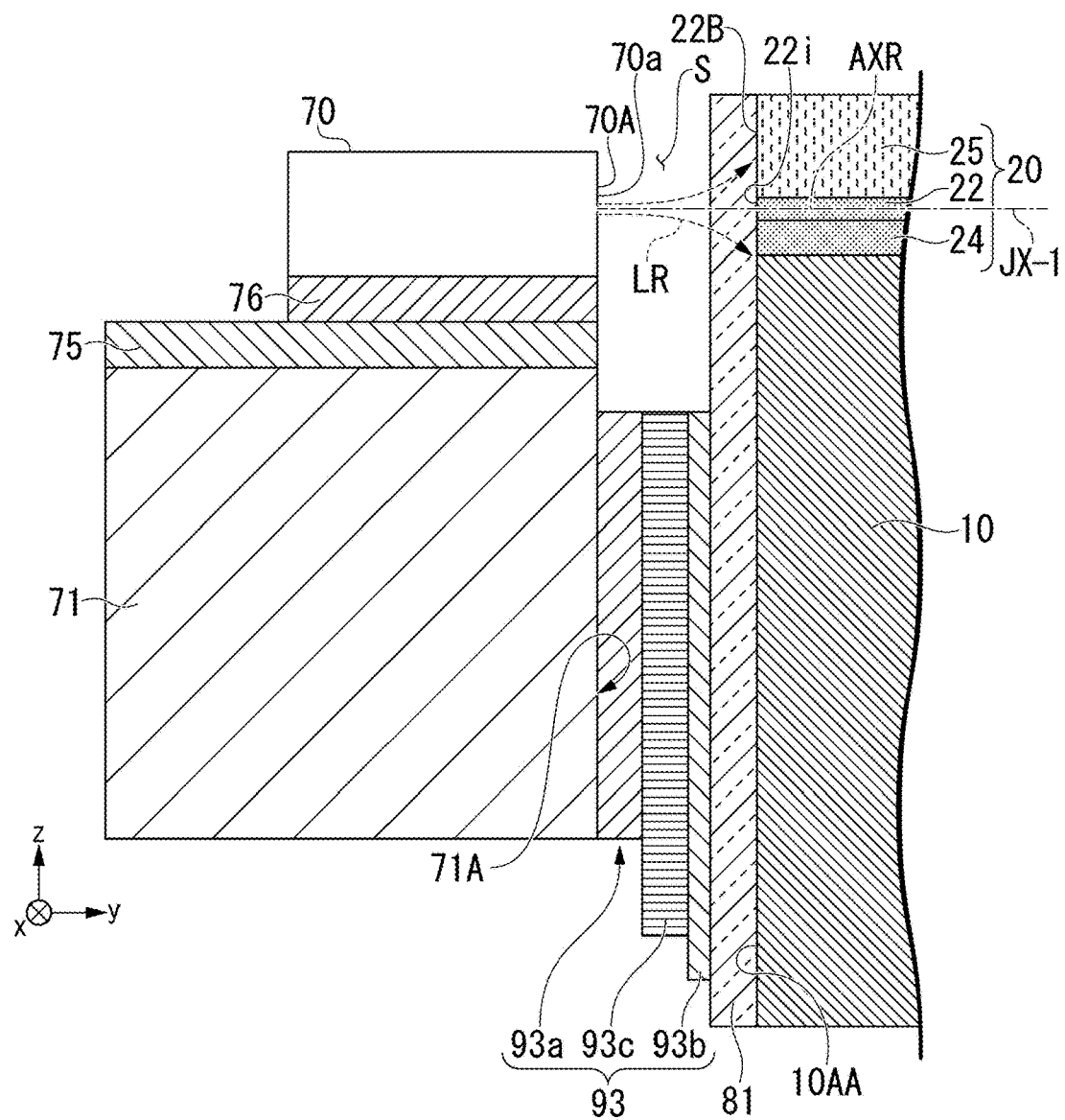
FIG. 19B is a schematic cross-sectional view along line X1-X1 in FIG. 19A.

61-1, 61-2, 61-3, and 71 are made of, for example, aluminum nitride (AlN), aluminum oxide (Al$_2$O$_3$), silicon (Si), or the like. As shown in FIGS. 19A and 19B, metallic layers 75 and 76 are provided between the subcarriers 61-1, 61-2, 61-3, and 71 and the LDs 60-1, 60-2, 60-3, and 70. The subcarriers 61-1, 61-2, 61-3, 71 and the LDs 60-1, 60-2, 60-3, and 70 are connected via the metallic layers 75 and 76. As a method of forming the metallic layers 75 and 76, a known method can be used and is not particularly specified, but a known method such as sputtering, vapor deposition, or application of a pasted metal can be used. The metallic layers 75 and 76 may include, for example, one or more metals selected from the group consisting of gold (Au), platinum (Pt), silver (Ag), lead (Pb), indium (In), nickel (Ni), titanium (Ti), tantalum (Ta), tungsten (W), an alloy of gold (Au) and tin (Sn), a tin (Sn)-silver (Ag)-copper (Cu)-based solder alloy (SAC), SnCu, InBi, SnPdAg, SnBiIn, and PbBiIn or may be composed of one or more metals selected from this group.

FIG. 19A is a schematic plan view obtained by enlarging a region surrounding the near-infrared light LD 70 and the second optical waveguide 22 and FIG. 19B is a schematic cross-sectional view taken along line X1-X1 in FIG. 19A. Also, in FIG. 19A, only the near-infrared light LD 70, the subcarrier 71, and the second optical waveguide 22 are shown.

The input ports 21-1i, 21-2i, 21-3i, and 22i of the optical waveguides 21-1, 21-2, 21-3, and 22 face the output ports of LDs 60-1, 60-2, 60-3, and 70 and are positioned so that lights output from the LDs 60-1, 60-2, 60-3, and 70 can be input to the input ports 21-21i, 21-2i, 21-3i, and 22i, such that the LDs 60-1, 60-2, 60-3, 60-3, and 70 are optically connected to the optical waveguides 21-1, 21-2, 21-3, and 22.

For example, an axis JX-1 of the input path substantially overlaps an optical axis AXR of the laser light LR output from an output port 70a of the LD 70. With such a configuration and arrangement, red light, green light, blue light, and near-infrared light emitted from the LDs 60-1, 60-2, 60-3, and 70 can be input to the input paths of the optical waveguides 21-1, 21-2, 21-3, and 22.

As shown in FIGS. 19A and 19B, the subcarrier 71 can be configured to be directly bonded to the substrate 10 via the metallic layer 93 (the first metallic layer 93a, the second metallic layer 93b, and the third metallic layer 93c). This configuration enables further miniaturization without performing spatial coupling or fiber coupling.

In the present embodiment, a side surface (first side surface) 71A facing the substrate 10 in the subcarrier 71 and a side surface (second side surface) 10AA facing the subcarrier 71 in the substrate 10 are connected via the first metallic layer 93a, the second metallic layer 93b, the third metallic layer 93c, and an antireflection film 81. A melting point of the metallic layer 75 is higher than a melting point of the third metallic layer 93c.

The first metallic layer 93a is provided in contact with the side surface 71A according to sputtering, vapor deposition, or the like, and may include, for example, one or more metals selected from the group consisting of gold (Au), platinum (Pt), silver (Ag), lead (Pb), indium (In), nickel (Ni), titanium (Ti), and tantalum (Ta), or may be composed of one or more metals selected from this group.

Preferably, the first metallic layer 93a includes at least one metal selected from the group consisting of gold (Au), platinum (Pt), silver (Ag), lead (Pb), indium (In), and nickel (Ni). The second metallic layer 93b is provided in contact with the side surface 10AA according to sputtering, vapor deposition, or the like, and may include, for example, one or more metals selected from the group consisting of titanium (Ti), tantalum (Ta) and tungsten (W), or may be composed of one or more metals selected from this group. Preferably, tantalum (Ta) is used for the second metallic layer 93b. The third metallic layer 93c is interposed between the first metallic layer 93a and the second metallic layer 93b, and may include, for example, one or more metals selected from the group consisting of aluminum (Al), copper (Cu), AuSn, SnCu, InBi, SnAgCu, SnPdAg, SnBiIn, and PbBiIn or may be composed of one or more metals selected from this group. Preferably, AuSn, SnAgCu, and SnBiIn are used as the third metallic layer 93c.

A thickness of the first metallic layer 93a, i.e., a size of the first metallic layer 93a in the y-direction, is, for example, 0.01 μm or more and 5.00 μm or less. A thickness of the second metallic layer 93b, i.e., a size of the second metallic layer 93b in the y-direction, is, for example, 0.01 μm or more and 1.00 μm or less. A thickness of the third metallic layer 93c, i.e., a size of the third metallic layer 93c in the y-direction, is, for example, 0.01 μm or more and 5.00 μm or less. The thickness of the third metallic layer 93c is preferably larger than the thicknesses of the first metallic layer 93a and the second metallic layer 93b. According to such a configuration, the above-described roles of the first metallic layer 93a, the second metallic layer 93b, and the third metallic layer 93c are well expressed, and the entry of the material of the first metallic layer 93a into the substrate 10 and the decrease in the adhesive strength of each metallic layer are suppressed. The thicknesses of the first metallic layer 93a, the second metallic layer 93b, and the third metallic layer 93c are measured, for example, according to spectroscopic ellipsometry.

The first metallic layer 93a is provided on a side surface facing the substrate 10 or the optical waveguide layer 20 in substantially the entire area of the side surface 71A without contact with the metallic layer 75. The front ends, i.e., the upper ends, of the second metallic layer 93b and the third metallic layer 93c in the z-direction reach the same position as the upper end of the first metallic layer 93a on the front side in the z-direction as an example. The rear ends, i.e., the lower ends, of the second metallic layer 93b and the third metallic layer 93c in the z-direction reach the same position as the lower ends of the subcarrier 71, the first metallic layer 93a, and the substrate 10 as an example. When viewed along the y-direction, the first metallic layer 93a is formed larger than the subcarrier 71 in the x-direction.

As described above, an area of the first metallic layer 93a, i.e., a size in a plane including the x- and z-directions, is substantially the same as the areas of the second metallic layer 93b and the third metallic layer 93c and the lower end thereof preferably reaches the same position as the lower ends of the subcarriers 61-1, 61-2, 61-3, and 71. In such a configuration, the connection strength of the subcarriers 61-1, 61-2, 61-3, and 71 to the substrate 10 is secured to the maximum extent. In other words, even if the LDs 60-1, 60-2, 60-3, and 70 and the subcarriers 61-1, 61-2, 61-3, and 71 are connected to internal electrode pads corresponding to the LDs 60-1, 60-2, 60-3, and 70 among a plurality of internal electrodes through wires using wire bonding, the disconnection of the subcarriers 61-1, 61-2, 61-3, and 71 and the substrate 10 can be suppressed. Also, because the lower ends of the subcarrier 71, the first metallic layer 93a, the second metallic layer 93b, the third metallic layer 93c, and the substrate 10 reach the same position, a heat dissipation path from the subcarriers 61-1, 61-2, 61-3, and 71 can be increased. In addition, the area of the first metallic layer 93a may be smaller than the areas of the second metallic layer 93b and the third metallic layer 93c.

In the video laser module 1000, an antireflection film 81 is provided between the LDs 60-1, 60-2, 60-3, and 70 and the optical waveguide layer 20. For example, the antireflection film 81 is integrally formed on the side surface 10AA of the substrate 10 and the input surface 20B of the optical waveguide layer 20.

However, the antireflection film 81 may be formed only on the input surface 20B of the optical waveguide layer 20.

The antireflection film 81 is a film for preventing input light towards the optical waveguide layer 20 from being reflected in a direction opposite a direction in which the input light enters from the input surface 20B and increasing the transmittance of the input light. The antireflection film 81 is a multilayer film formed of, for example, a plurality of types of dielectrics alternately laminated at a prescribed thickness corresponding to the wavelengths of red light, green light, and blue light that are input light. Examples of the above-described dielectric include titanium oxide ($TiO_2$), tantalum oxide ($Ta_2O_5$), silicon oxide ($SiO_2$), aluminum oxide ($Al_2O_3$), and the like.

The output surface 70A of the LD 70 and the input surface 20B of the optical waveguide layer 20 are arranged at prescribed intervals. The input surface 20B faces the output surface 70A and there is a gap S between the output surface 70A and the input surface 20B in the y-direction. Because the video laser module 1000 is exposed in the air, the gap S is filled with air. Because the gap S is filled with the same gas (air), it is easy to input light of each color emitted from the LD 70 to the input path in a state in which prescribed coupling efficiency is satisfied. In the case where the video laser module 1000 is used for AR glasses and VR glasses, the size of the gap (interval) S in the y-direction is, for example, larger than 0 μm and smaller than or equal to 5 μm, on the basis of a light intensity required for the AR glasses and VR glasses and the like.

Second Embodiment

Figure 20:
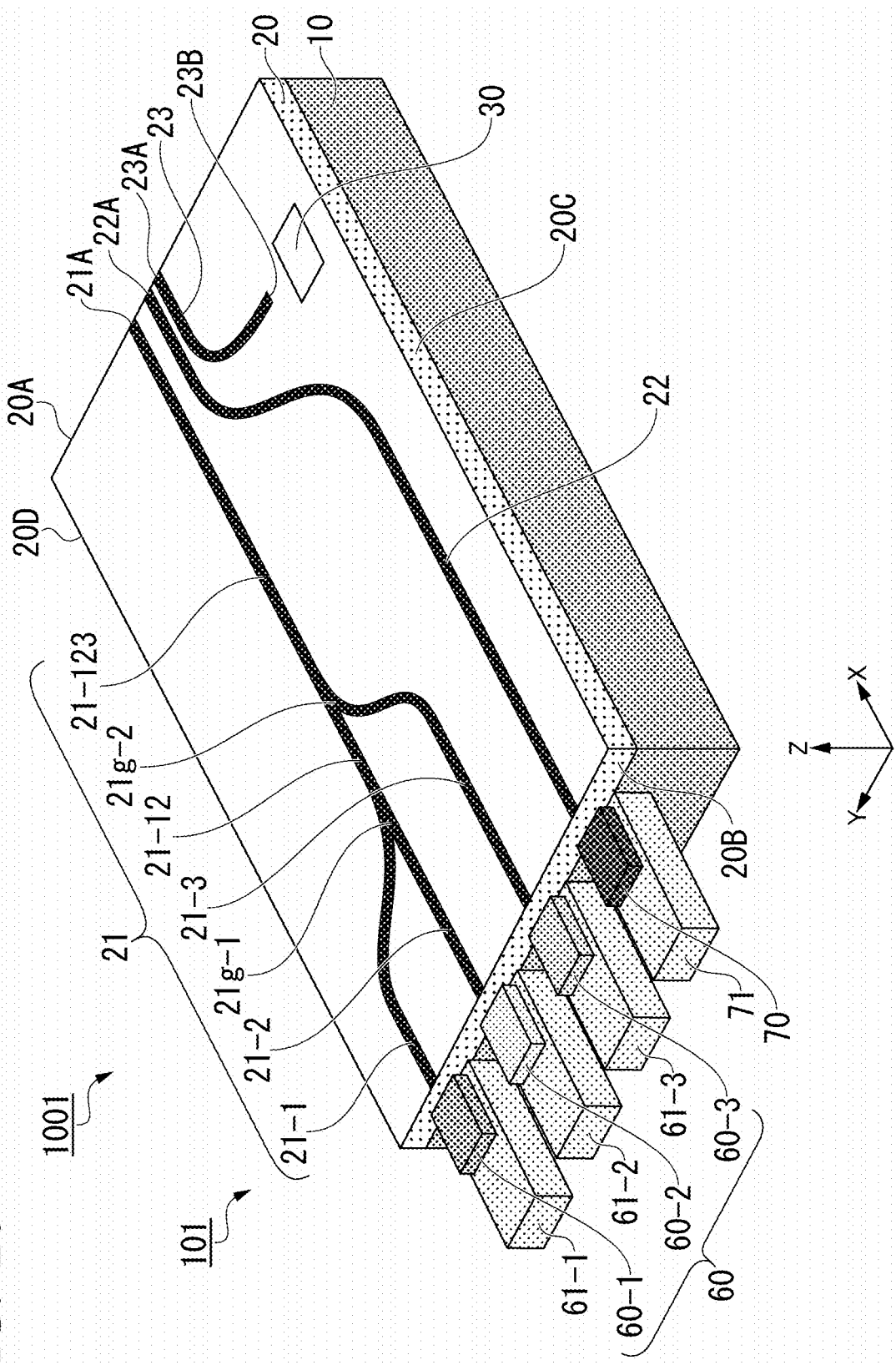
FIG. 20 is a schematic perspective view of a video laser module according to the second embodiment.

FIG. 20 is a schematic perspective view of a video laser module according to the second embodiment.

The video laser module according to the second embodiment is different from the optical waveguide detection element according to the first embodiment in that the photodetector is formed in the optical waveguide layer.

Hereinafter, members substantially identical to components described in the video laser module according to the first embodiment are denoted by the same reference signs, and descriptions thereof may be omitted.

A video laser module 1001 shown in FIG. 20 includes the optical waveguide detection element 101 shown in FIG. 5; a red laser light source 60-1, a green laser light source 60-2, and a blue laser light source 60-3 configured to output visible light lasers to three input ports 21-1i, 21-2i, and 21-3i of the first optical waveguide 21 provided in the optical waveguide detection element 101; and a near-infrared laser light source 70 configured to output a near-infrared light laser toward the input port 22i of the second optical waveguide 22 provided in the optical waveguide detection element 101.

Third Embodiment

A video laser module according to the third embodiment is different from the video laser module according to the second embodiment in terms of a spin photodetector.

Hereinafter, members substantially identical to components described in the video laser modules according to the first embodiment and the second embodiment are denoted by the same reference signs, and descriptions thereof may be omitted.

The video laser module according to the third embodiment includes an optical waveguide detection element 102 having a spin photodetector 30 shown in FIG. 14.

Fourth Embodiment

Figure 21:
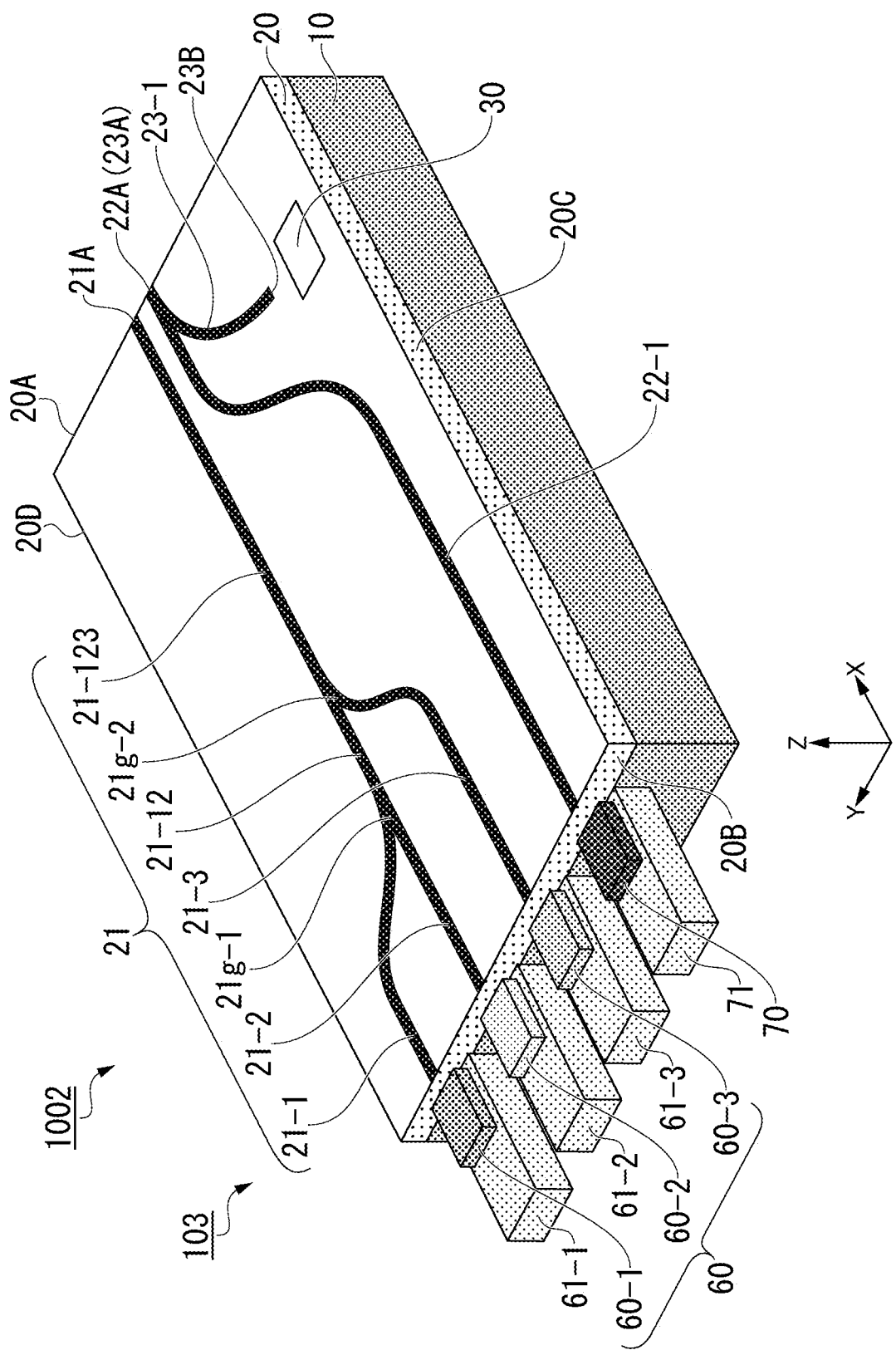
FIG. 21 is a schematic perspective view of a video laser module according to the fourth embodiment.

FIG. 21 is a schematic perspective view of the video laser module according to the fourth embodiment.

In the fourth embodiment, components similar to those of the first embodiment, the second embodiment, and the third embodiment are denoted by similar reference signs, and descriptions thereof are omitted.

A video laser module 1002 shown in FIG. 21 includes the optical waveguide detection element 103 shown in FIG. 17; a red laser light source 60-1, a green laser light source 60-2, and a blue laser light source 60-3 configured to output visible light lasers to three input ports 21-1i, 21-2i, and 21-3i of the first optical waveguide 21 provided in the optical waveguide detection element 103; and a near-infrared laser light source 70 configured to output a near-infrared light laser toward the input port 22i of the second optical waveguide 22-1 provided in the optical waveguide detection element 103.

The video laser module according to the above-described embodiment includes a synchronization mechanism for achieving timing synchronization of the near-infrared laser light source 70 and the photodetector 30, the near-infrared laser light source 70 applies pulsed light and the photodetector 30 detects light that has been reflected and returned after the light has been applied, such that it is possible to measure a distance to a reflective object.

In the video laser module according to the above-described embodiment, a pulse width of the near-infrared laser light source 70 may be 100 nanoseconds or less.

Method of Manufacturing Video Laser Module

Figure 22:
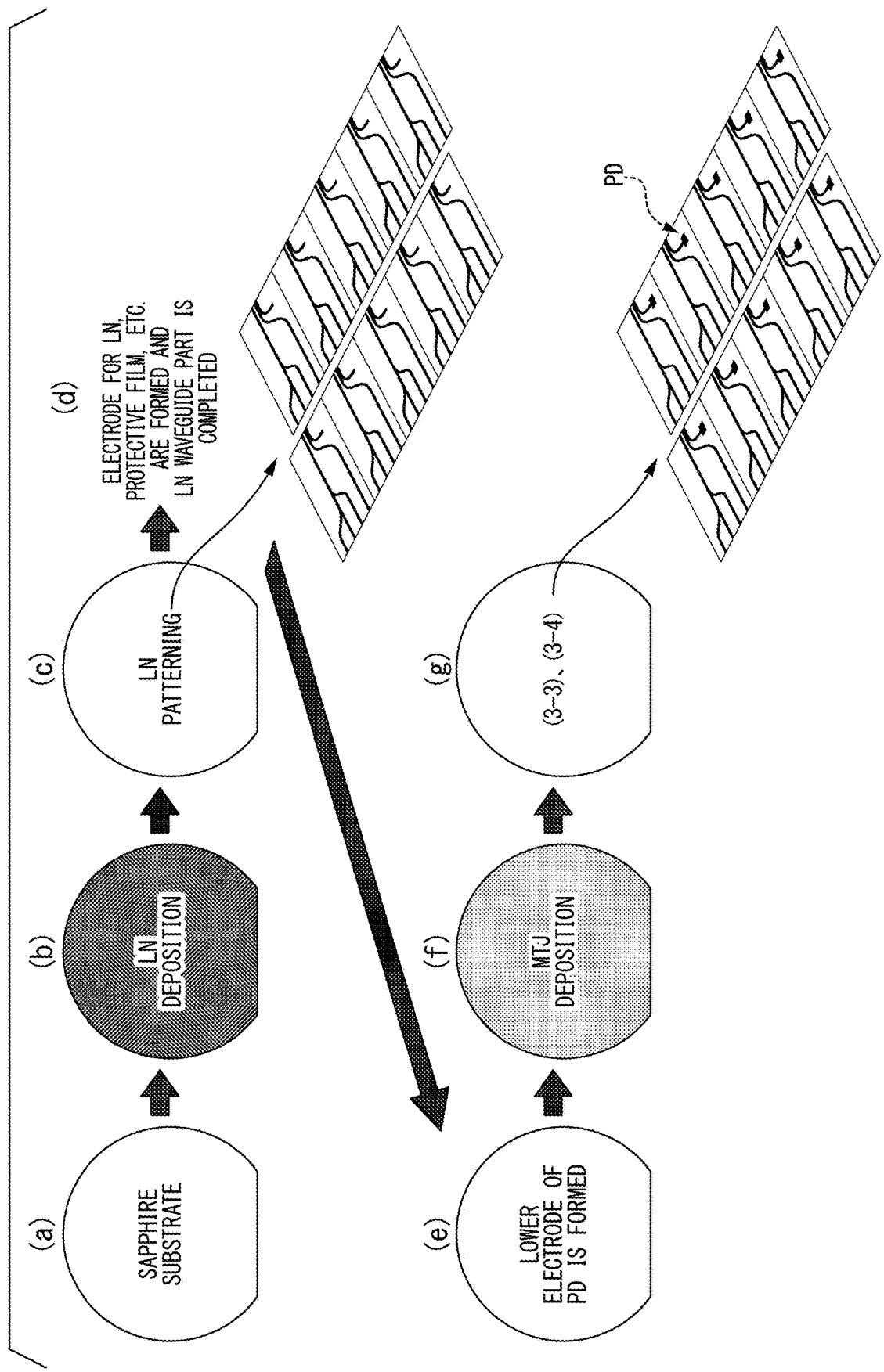
FIG. 22 is a conceptual diagram showing a main process of a method of manufacturing a video laser module including an optical waveguide detection element according to the present embodiment.
Figure 23:
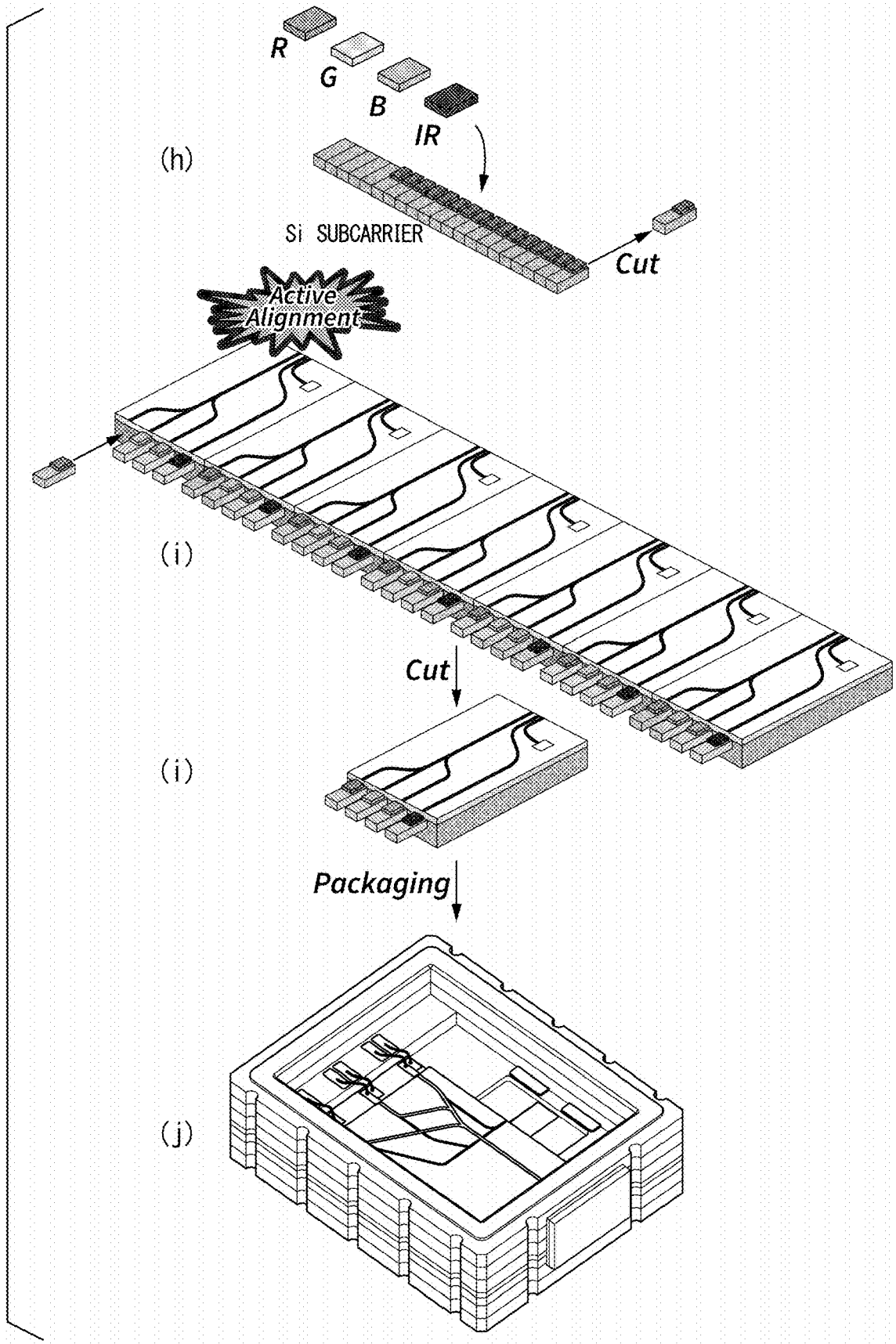
FIG. 23 is a conceptual diagram showing a main process of a method of manufacturing a video laser module including an optical waveguide detection element according to the present embodiment.

An example of a main process of a method for manufacturing a video laser module including an optical waveguide detection element according to the present embodiment will be described with reference to FIGS. 22 and 23.

(First Step)

Substrate for manufacturing device is provided (see FIG. 22(a)).

A substrate for manufacturing a device is provided. Examples of the substrate for manufacturing the device include a sapphire substrate, a Si substrate, a thermal silicon oxide substrate, and the like.

(Second Step)

Optical waveguide layer is formed (high-temperature process at a temperature of 550° C. or more) (see FIGS. 22(b) to 22(d)).

An optical waveguide layer having an optical waveguide of $LiNbO_3$ is formed.

(2-1) First, a film of $LiNbO_3$ is formed.

(2-2) The film of $LiNbO_3$ is patterned and a surrounding region is embedded with a waveguide cladding material.

(2-3) In the case where a Mach-Zehnder-type optical waveguide is manufactured, a buffer layer and a metallic electrode layer are formed and patterned to apply an electric field to the film of $LiNbO_3$.

(Third Step)

Spin photodetectors are manufactured (process at a temperature of 450° C. or less) (see FIGS. 22(e) to 22(g)).

(3-1) A lower electrode is formed.
thereof.
(3-2) An MTJ is deposited.
(3-3) The MTJ is patterned and an insulating layer is buried in the vicinity
(3-4) An upper electrode (a transparent electrode such as ITO) is formed.

(Fourth Step)

A wafer completed in the above-described step is cut into bars (optical waveguide detection element is completed before LD is bonded) (see FIG. 22(h)).

(Fifth Step)

Subcarrier with LD mounted thereon is bonded to the above-described bar by active alignment bonding.

(5-1) An Si substrate is provided. An electrode for supplying an electric current to the LD is formed on the Si substrate to form a subcarrier.
(5-2) The LDs are formed. The wafer is diced and the LDs are divided into chips. This processing is performed in parallel with (5-1).
(5-3) The LD chips obtained in a dividing process in (5-2) are precisely positioned and joined on the subcarriers provided in (5-1).
(5-4) The bars of the subcarriers where the LDs are joined are cut one by one.
(5-5) A current is supplied to an electrode provided in the subcarrier and the laser is oscillated therefrom in a state in which it is electrically connected to the LD. In this state, the LD is approached to the input port of the bar-shaped device obtained in (5-4) while the position is adjusted. Then, the light intensity is detected by the light sensor at the output port, a position where the intensity is maximized is found, and the subcarrier and the device (5-4) are metal-bonded at that position. Metal bonding is performed by applying a YAG laser and welding metals deposited on the end surface in advance.
(5-6) The processing of (5-5) is repeated for each color LD.
(5-7) When all LDs are joined, the bars are cut for each individual device.
(5-8) A video laser module before packaging is completed (see FIG. 23(i)).

(Sixth Step)

A base package is manufactured.

(Seventh Step)

The video laser module completed in the fifth step is inserted into the package serving as the base of the sixth step and electrical connections are made between the module and the electrodes of the package (see FIG. 23(j)).

(Eighth Step)

The video laser module is completed by covering and sealing the package.

[XR Glasses]

In the XR glasses according to the present embodiment, any one of the video laser modules according to the above-described embodiment is mounted on the glasses.

The XR glasses (eyeglasses) are eyeglasses-type terminals and XR is a general term for virtual reality (VR), augmented reality (AR), and mixed reality.

Figure 24:
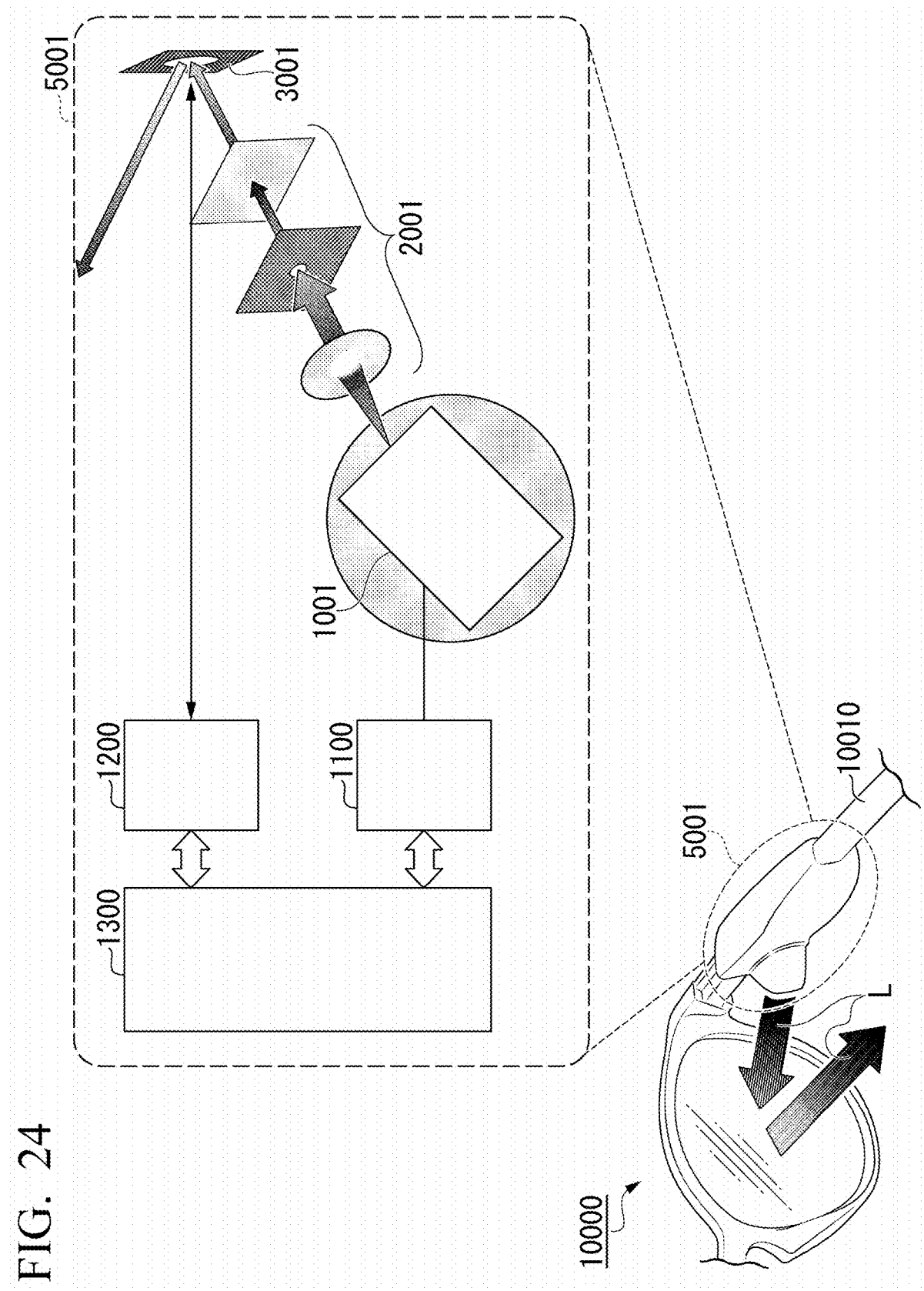
FIG. 24 is a conceptual diagram for describing XR glasses according to the present embodiment.

In FIG. 24, a conceptual diagram for describing the XR glasses according to the present embodiment is shown.

The XR glasses 10000 shown in FIG. 24 have a video laser module 1001 mounted on a frame 10010. Reference sign L denotes image display light.

In FIG. 24, an optical engine 5001 is a combination of the video laser module 1001, an optical scanning mirror 3001, and an optics system 2001 connecting the video laser module 1001 and the optical scanning mirror 3001. As the video laser module 1001, a video laser module according to the above-described embodiment is used.

For example, RGB laser light sources, i.e., a red laser light source 60-1, a green laser light source 60-2, and a blue laser light source 60-3, and a near-infrared laser light source 70 can be used as the light source in the video laser module 1001.

Figure 25:
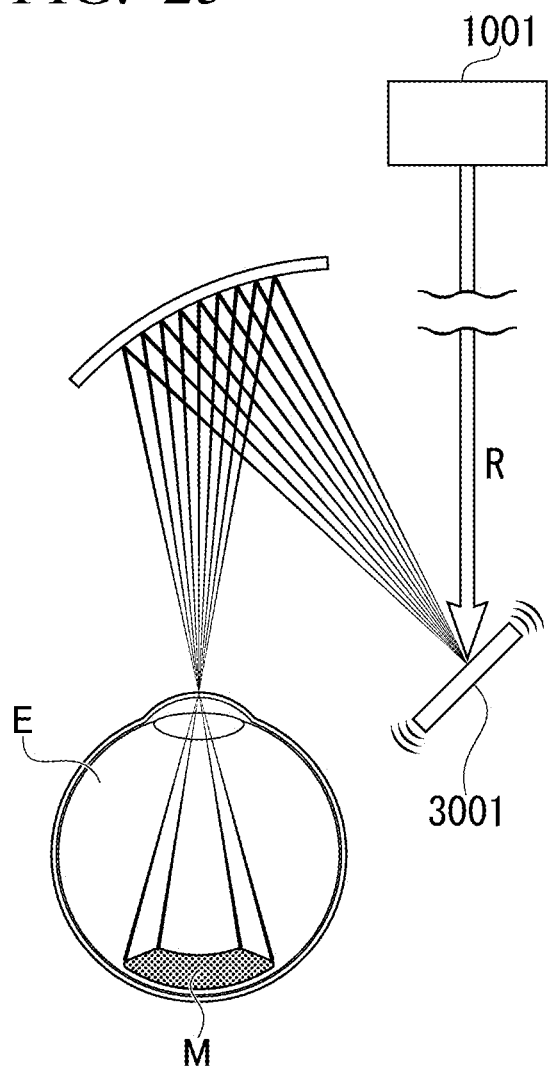
FIG. 25 is a conceptual diagram showing a state in which an image is projected directly onto a retina by laser light output from the video laser module according to the present embodiment.

As shown in FIG. 25, the laser light applied from the video laser module 1001 attached to an eyeglasses frame is reflected by the optical scanning mirror 3001 and enters the person's eyeball E, and an image (a video) can be projected directly onto a retina M.

By providing an eye tracking mechanism, an image is projected directly onto the retina while eye tracking is performed. A known eye tracking mechanism can be used.

The optical scanning mirror 3001 is, for example, a MEMS mirror. In order to project a 2D image, it is preferably a biaxial MEMS mirror that vibrates to reflect laser light by changing an angle in the horizontal direction (X-direction) and the vertical direction (Y-direction).

As the optics system 2001 that optically processes the laser light output from the video laser module 1001, a collimator lens 2001a, a slit 2001b, and an ND filter 2001c are provided. This optics system is an example and may have other configurations.

The optical engine 5001 includes a laser driver 1100, an optical scanning mirror driver 1200, and a video controller 1300 that controls these drivers.

Figure 26:
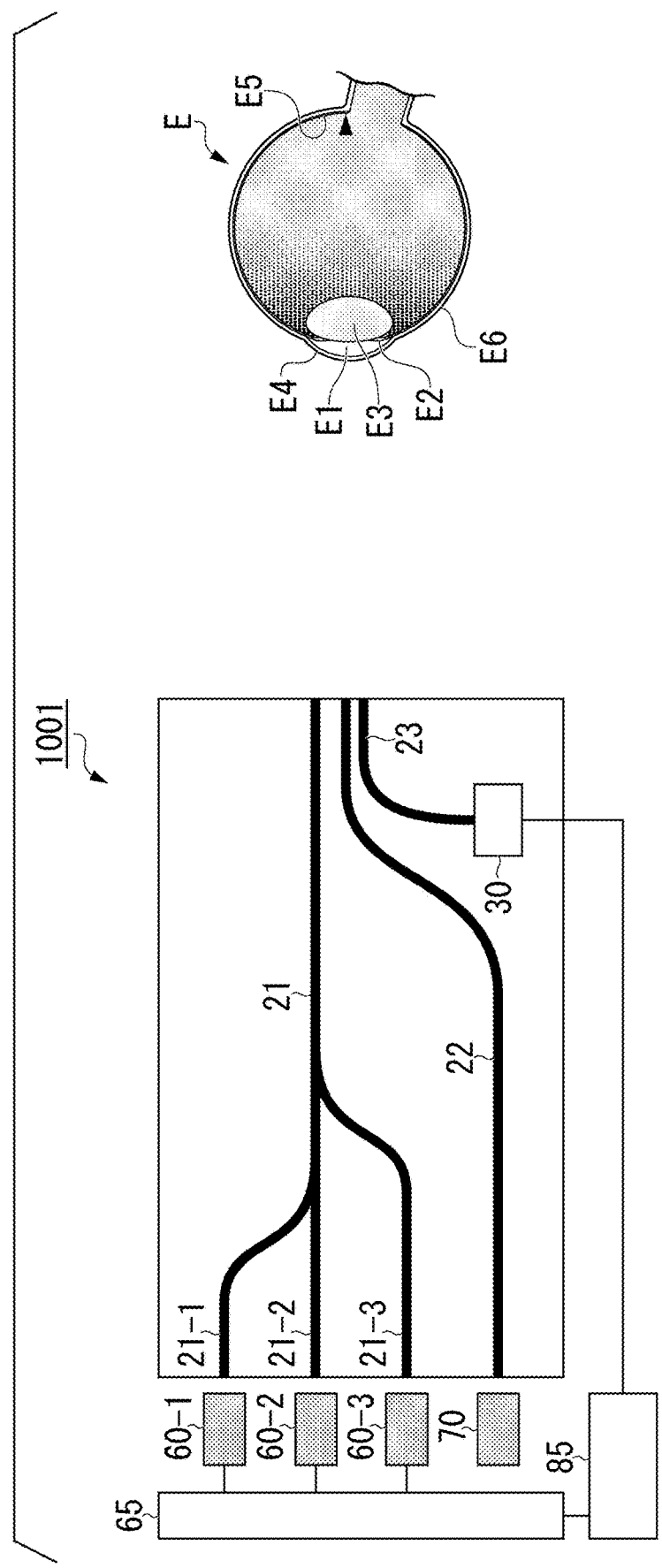
FIG. 26 is a conceptual diagram of a control system of the video laser module and a schematic diagram of an eyeball.

In FIG. 26, a conceptual diagram of the control system of the video laser module 1001 and a schematic diagram of the eyeball E are shown.

The visible laser light sources 60-1, 60-2, and 60-3 and the near-infrared laser light source 70 are connected to an electrical signal generation element 65 that independently generates an electrical signal for controlling a drive current.

Also, the electrical signal generation element 65 and the photodetector 30 are connected to a processor 85 including a synchronization signal generation device. Thereby, a distance to the reflective object can be determined by emitting pulsed light from the near-infrared laser light source 70 and detecting the near-infrared light reflected and returned after the pulsed light is emitted with the photodetector 30.

In the eyeball E, reference signs E1, E2, E3, E4, and E5 denote a pupil, an iris, a lens (eye lens), a cornea, and a retina, respectively.

Measurement of the distance to the surface (cornea) of the eyeball or the retina of the eyeball, which is a reflective object, will be described with reference to FIGS. 27 to 29.

The video laser module 1001 outputs near-infrared laser pulsed light LP1 from the near-infrared light output port 22A of the second optical waveguide 22 toward the eyeball E along an optical path OP1. The pulsed light LP1 is reflected by the retina E5 of the eyeball E and a surface E6 of the eyeball E (for example, the cornea E4 and the sclera), and the reflected light returned along an optical path ROP1 propagates from the reflected light input port 23A to the third optical waveguide 23 and is detected by the photodetector 30 of the video laser module 1001.

Figure 27:
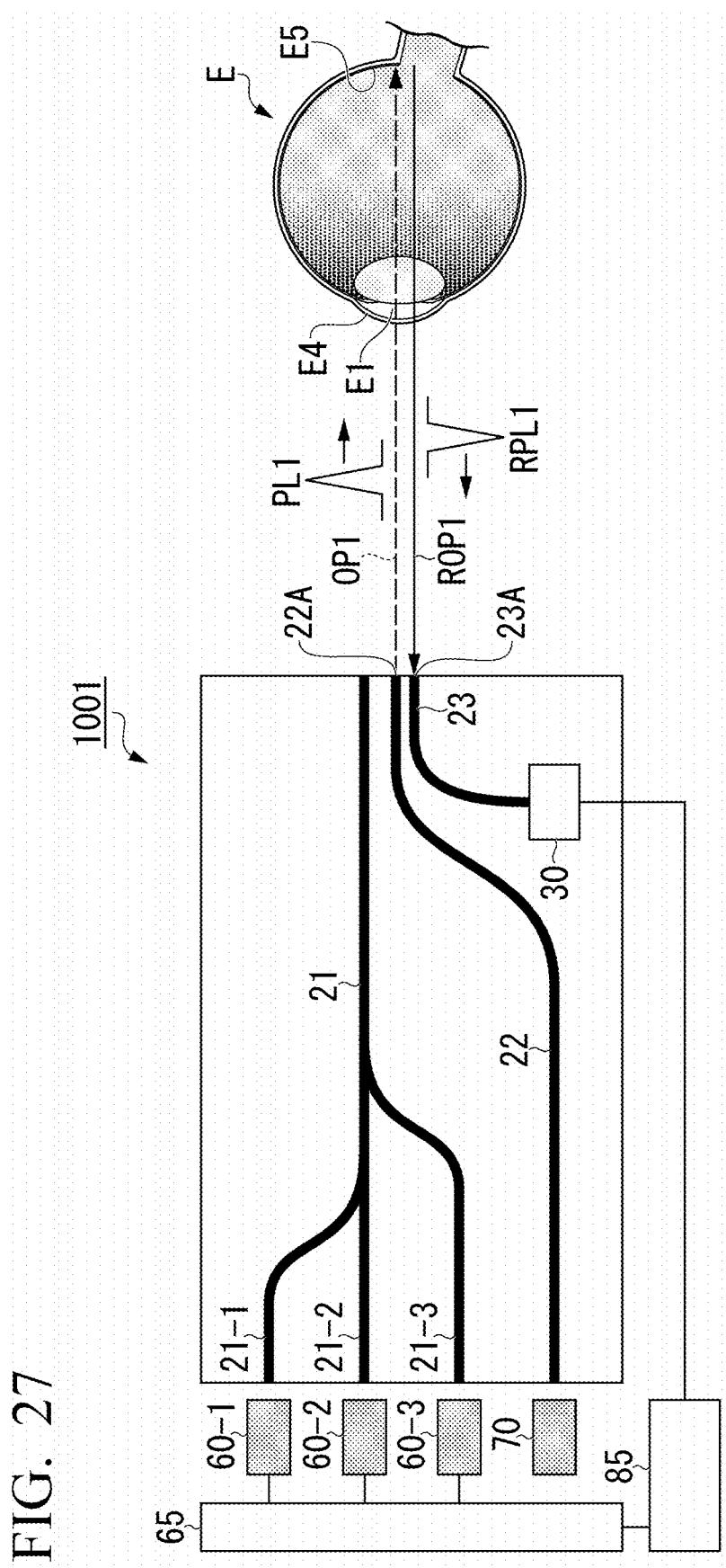
FIG. 27 is a schematic diagram for describing a method of measuring a distance to the retina of the eyeball.

In FIG. 27, the eyeball E is oriented at a first angle. The near-infrared laser pulsed light LP1 applied from the near-infrared light output port 22A of the second optical waveguide 22 toward the eyeball E propagates along the optical path OP1, enters the eyeball E through the pupil E1, and is reflected by the retina E5 of the eyeball E. A reflected pulsed light RLP1 returns along the optical path ROP1 and is detected by the photodetector 30 of the video laser module 1001.

Figure 28:
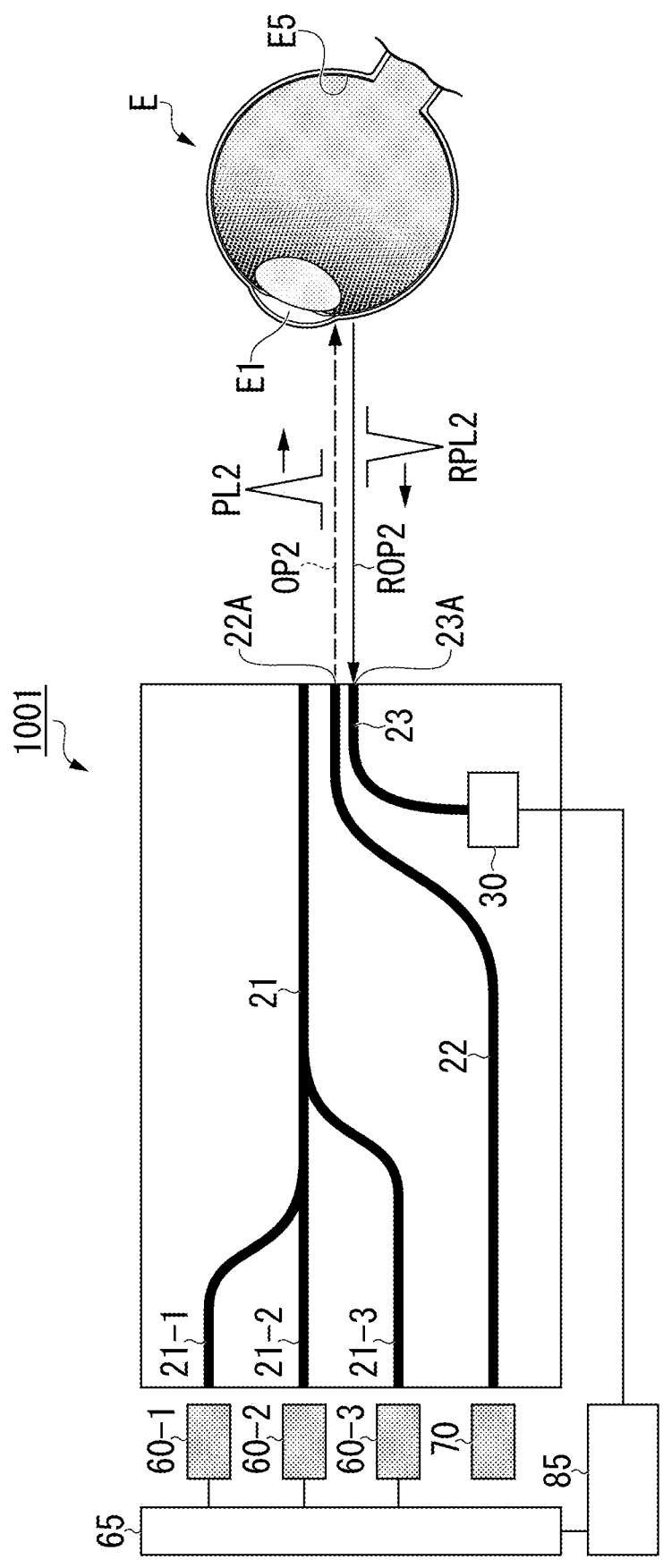
FIG. 28 is a schematic diagram for describing a method of measuring the distance to a surface of the eyeball.

In FIG. 28, the eyeball E is oriented at a second angle. Near-infrared laser pulsed light LP2 applied from the near-infrared light output port 22A of the second optical waveguide 22 toward the eyeball E propagates along an optical path OP2 and is reflected on the surface E6 of the eyeball E. A reflected pulsed light RLP2 returns along an optical path ROP2 and is detected by the photodetector 30 of the video laser module 1001.

Figure 29:
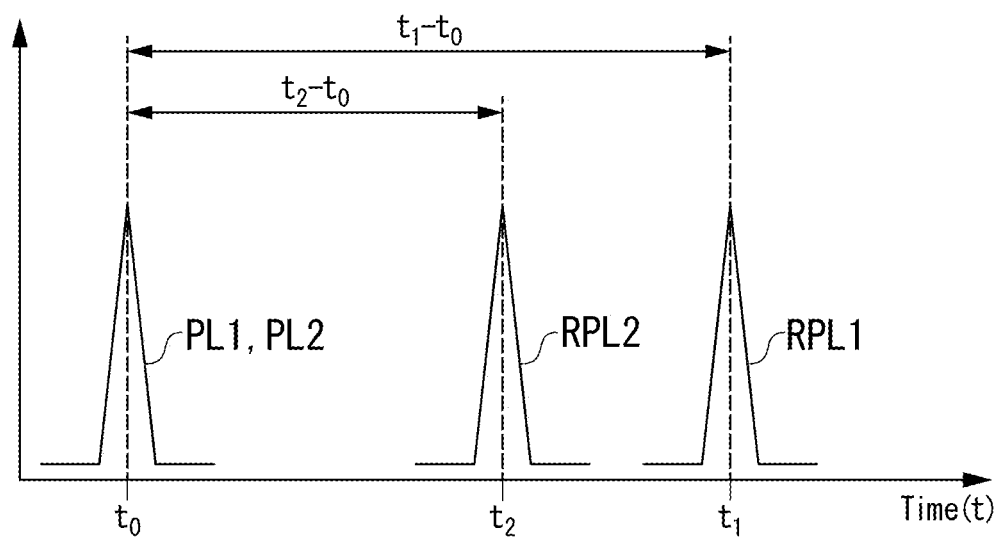
FIG. 29 is a diagram for describing a process in which the distance to the retina and the distance to the surface of the eyeball can be identified on the basis of a flight period of time.

In FIG. 29, the horizontal axis represents the elapse of time from the time (time to) when the pulsed light is emitted from the near-infrared laser light source 70 to the time when the pulsed light is detected by the photodetector 30 in each of a case where the eyeball E is oriented at the first angle and a case where the eyeball E is oriented at the second angle.

In the case where the eyeball E is oriented at the first angle, the pulsed light LP1 is output toward the eyeball E at time to and output time to is recorded in the processor 85. The pulsed light LP1 is input to the pupil E1 of the eyeball E and is reflected by the retina E5. The reflected pulsed light RLP1 is detected by the video laser module 1001 at time $t_1$. $t_1$-$t_0$ corresponds to a flight period of time from the time when pulsed light is output to the time when the pulsed light is detected. On the basis of the flight period of time $t_1$-$t_0$, a distance between the video laser module 1001 and the retina E5 from which the pulsed light LP1 is reflected is decided.

Likewise, in the case where the eyeball E is oriented at a second angle, $t_2$-$t_0$ corresponds to a flight period of time from the time when pulsed light is output to the time when the pulsed light is detected. On the basis of the flight period of time $t_2$-$t_0$, a distance between the video laser module 1001 and the surface E6 from which pulsed light LP2 is reflected is decided.

The video laser module 1001 determines whether the flight period of time corresponds to a flight period of time of the pulsed light reflected from the retina E5 of the eyeball E or whether the flight period of time corresponds to a flight period of time of the pulsed light reflected from the surface E6 of the eyeball E on the basis of the distance decided on the basis of the flight periods of time $t_1$-$t_0$ and $t_2$-$t_0$.

The distance to the retina and the distance to the eyeball surface can be identified on the basis of the flight periods of time $t_1$-$t_0$ and $t_2$-$t_0$.

Because the size of the eyeball is about 20 mm, a difference in a flight period of time is small, but the spin photodetector is fast and can perform distance measurement.

In the XR glasses according to the present embodiment, a configuration in which the near-infrared light is applied from the near-infrared laser light source 70, an intensity of light reflected and returned after being applied to the reflective object is detected by the photodetector 30, and the processor 85 identifies the reflective object on the basis of the light intensity may be adopted.

In the XR glasses according to the present embodiment, a configuration in which a light intensity due to a difference in reflectance is detected using the photodetector 30, and the processor 85 decides on a position of the eyeball on the basis of the intensity may be adopted.

For example, the reflectance is different between the retina and the sclera on the surface of the eyeball (a so-called white eye that is relatively hard) and the intensity of the light that is received changes, such that the position of the pupil of the eye can be detected.

The XR glasses according to the present embodiment preferably include an actuator mechanism that moves the video laser module on the basis of information of the eye tracking mechanism.

As the actuator mechanism, for example, a mechanism in which a video laser module is installed on a two-dimensional stage and moves with a linear actuator can be used. As the linear actuator, a piezoelectric ultrasonic linear motor can be used. Also, an actuator using a spherical motor or a voice coil motor can be used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

10 Substrate
20 Optical waveguide layer
20A One end surface
21 First optical waveguide
21A Visible light output port
22 Second optical waveguide
22A Near-infrared light output port
23 Third optical waveguide
23A Reflected light input port
30 Photodetector
100, 101, 102, 103 Optical waveguide detection element
1000, 1001, 1003 Video laser module
10000 XR glasses

What is claimed is:

1. An optical waveguide detection element comprising:
a substrate;
an optical waveguide layer formed on the substrate; and
a photodetector,
wherein the optical waveguide layer includes:
a first optical waveguide in which visible light having a wavelength of 380 nm to 800 nm propagates;
a second optical waveguide in which near-infrared light having a wavelength of 801 nm to 2000 nm propagates; and
a third optical waveguide in which light propagates to a light receiving surface of the photodetector, and
wherein a visible light output port of the first optical waveguide from which the visible light is output, a near-infrared light output port of the second optical waveguide from which the near-infrared light is output, and a reflected light input port of the third optical waveguide to which the near-infrared light is reflected and returned are arranged on one end surface of the optical waveguide layer.

2. The optical waveguide detection element according to claim 1, wherein a center distance between the visible light output port and the near-infrared light output port is 0 mm to 5 mm.

3. The optical waveguide detection element according to claim 2, wherein a center distance between the near-infrared light output port and the reflected light input port is 0 mm to 5 mm.

4. The optical waveguide detection element according to claim 3, wherein the near-infrared light output port and the reflected light input port are common.

5. The optical waveguide detection element according to claim 1, wherein the photodetector is formed in the optical waveguide layer.

6. The optical waveguide detection element according to claim 1, wherein the optical waveguide layer is formed of a material containing lithium niobate.

7. The optical waveguide detection element according to claim 1, wherein the substrate is a sapphire substrate.

8. The optical waveguide detection element according to claim 1, wherein the photodetector is a spin photodetector having a magnetoresistance effect function in which a first ferromagnetic layer, a spacer layer, and a second ferromagnetic layer are laminated.

9. The optical waveguide detection element according to claim 1, wherein, in light reception sensitivity of the photodetector, sensitivity to the near-infrared light is higher than sensitivity to the visible light.

10. A video laser module comprising:
   the optical waveguide detection element according to claim 1;
   a visible laser light source configured to output the visible light; and
   a near-infrared laser light source configured to output the near-infrared light.

11. The video laser module according to claim 10, wherein the visible laser light source includes lasers of three colors of red, green, and blue and laser light of the three colors is multiplexed in the optical waveguide layer and output from one visible light output port.

12. The video laser module according to claim 10, wherein a center distance between the visible light output port and the near-infrared light output port is 5 mm or less.

13. The video laser module according to claim 10, wherein a center distance between the near-infrared light output port and the reflected light input port is 5 mm or less.

14. The video laser module according to claim 10, further comprising a synchronization mechanism configured to synchronize timings of light emission of the near-infrared laser light source and detection of the photodetector,
   wherein the near-infrared laser light source applies pulsed light and measures a distance to a reflective object by detecting the light that is applied and then reflected and returned with the photodetector.

15. The video laser module according to claim 14, wherein a pulse width of the near-infrared laser light source is 100 nanoseconds or less.

16. XR glasses comprising: glasses; and the video laser module according to claim 10 mounted on the glasses.

17. The XR glasses according to claim 16, further comprising an eye tracking mechanism capable of identifying a distance to a retina and a distance to an eyeball surface.

18. The XR glasses according to claim 17, further comprising an actuator mechanism configured to move the video laser module on the basis of information of the eye tracking mechanism.

19. The XR glasses according to claim 16, wherein light is applied from the near-infrared laser light source, an intensity of the light that is applied to the reflective object and then reflected and returned is detected, and the reflective object is detected according to the intensity of the light.

20. The XR glasses according to claim 16, wherein a position of an eyeball is able to be recognized according to a reflectance difference.

* * * * *